US007796422B2

United States Patent
Kajiyama

(12) United States Patent
(10) Patent No.: US 7,796,422 B2
(45) Date of Patent: Sep. 14, 2010

(54) MAGNETIC RANDOM ACCESS MEMORY AND WRITE METHOD OF THE SAME

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 12/333,472

(22) Filed: Dec. 12, 2008

(65) Prior Publication Data

US 2009/0154224 A1 Jun. 18, 2009

(30) Foreign Application Priority Data

Dec. 18, 2007 (JP) ............................ 2007-326232

(51) Int. Cl.
*G11C 11/00* (2006.01)

(52) U.S. Cl. .................. 365/158; 365/189.16; 365/171

(58) Field of Classification Search ................ 365/158, 365/148, 171, 173, 189.09, 189.16
See application file for complete search history.

(56) References Cited

U.S. PATENT DOCUMENTS 6,487,113 B1 * 11/2002 Park et al. .................. 365/163
7,385,868 B2 * 6/2008 Moore et al. ............... 365/222

FOREIGN PATENT DOCUMENTS

JP 2006-286726 10/2006

OTHER PUBLICATIONS

W.C. Jeong, et al., "Highly scalable MRAM using field assisted current induced switching", 2005 Symposium on VLSI Technology Digest of Technical Papers, pp. 184-185.

* cited by examiner

*Primary Examiner*—Gene N. Auduong
(74) *Attorney, Agent, or Firm*—Oblon, Spivak, McClelland, Maier & Neustadt, L.L.P.

(57) ABSTRACT

A spin transfer type magnetic random access memory includes a magnetoresistive effect element including a fixed layer, a recording layer, and a nonmagnetic layer, a source line connected to one terminal of the magnetoresistive effect element, a transistor having a current path whose one end is connected to the other terminal of the magnetoresistive effect element, a bit line connected to the other end of the current path of the transistor, and running parallel to the source line, and a source/sinker which supplies a write current between the source line and the bit line via the magnetoresistive effect element and the transistor, a direction in which a magnetic field generated by the write current having passed through the bit line is applied to the magnetoresistive effect element being opposite to a direction of the write current passing through the magnetoresistive effect element.

20 Claims, 19 Drawing Sheets

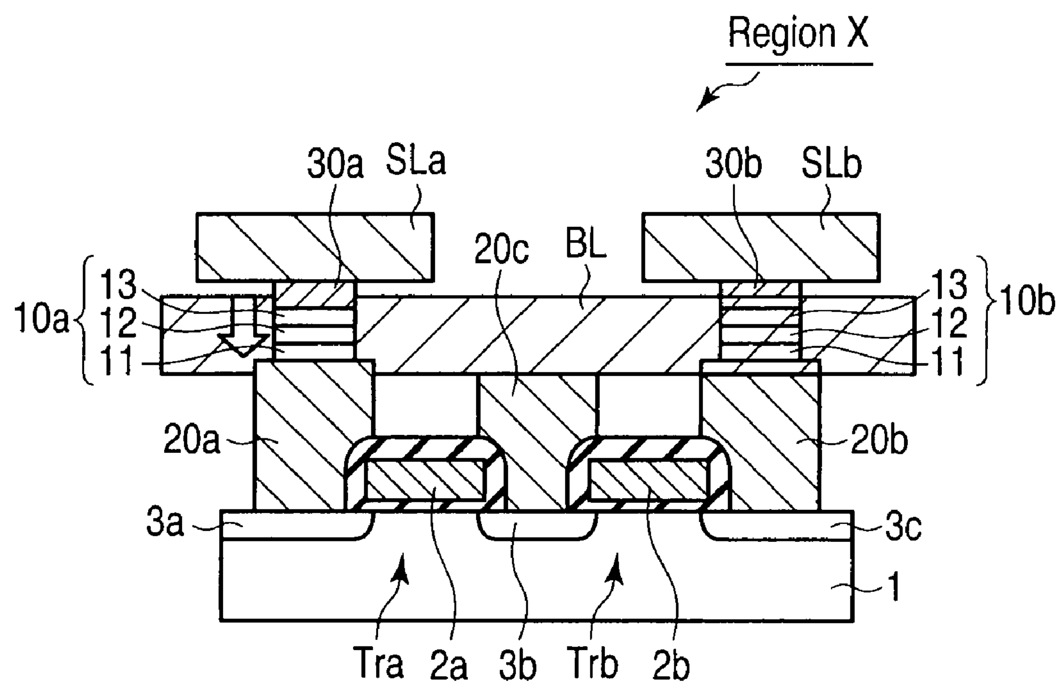
F I G. 2
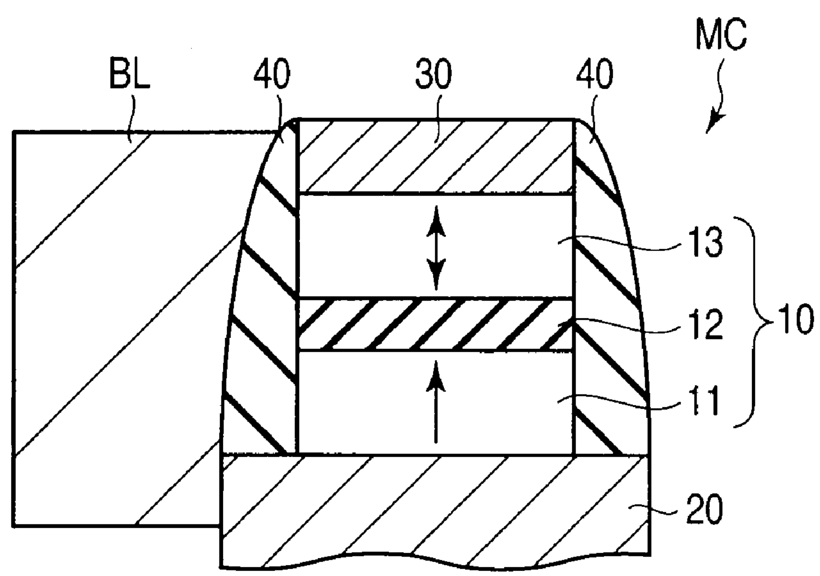
F I G. 3

"1" Write (reference example 1)

"1" Write (reference example 1)

"0" Write (reference example 1)

"0" Write (reference example 1)

"1" Write (reference example 2)
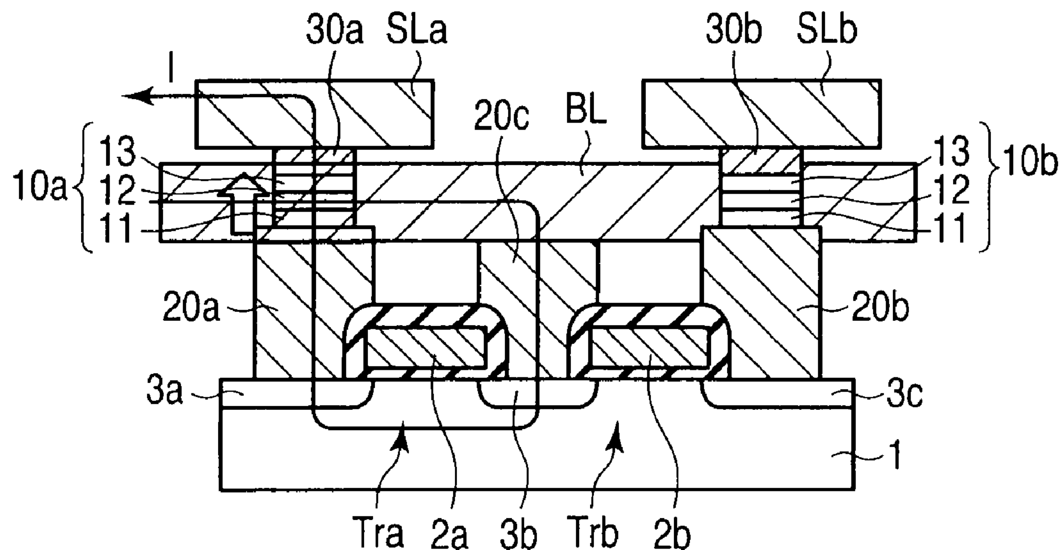
F I G. 13A
"1" Write (reference example 2)
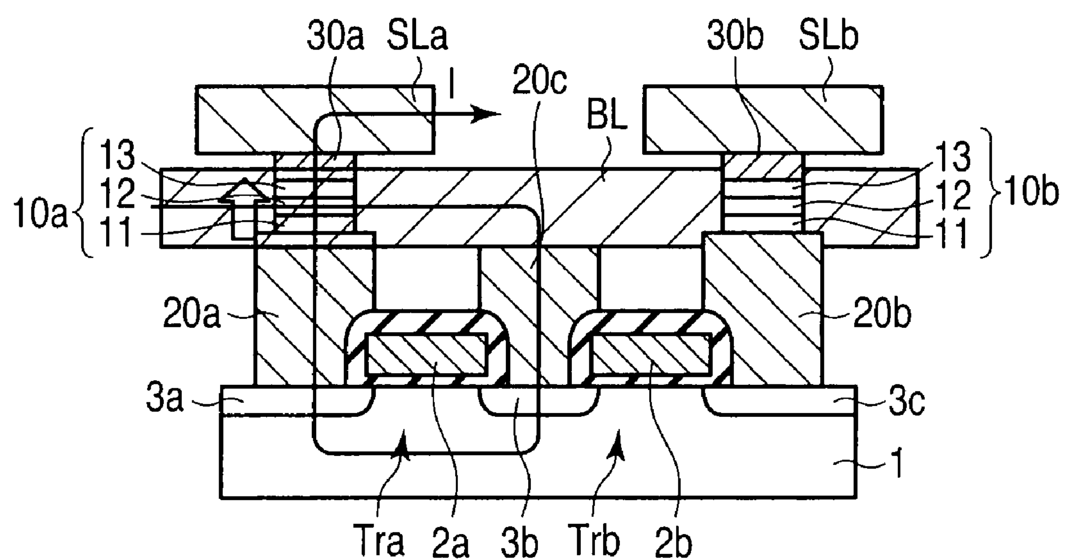
F I G. 13B "1" Write (reference example 2)
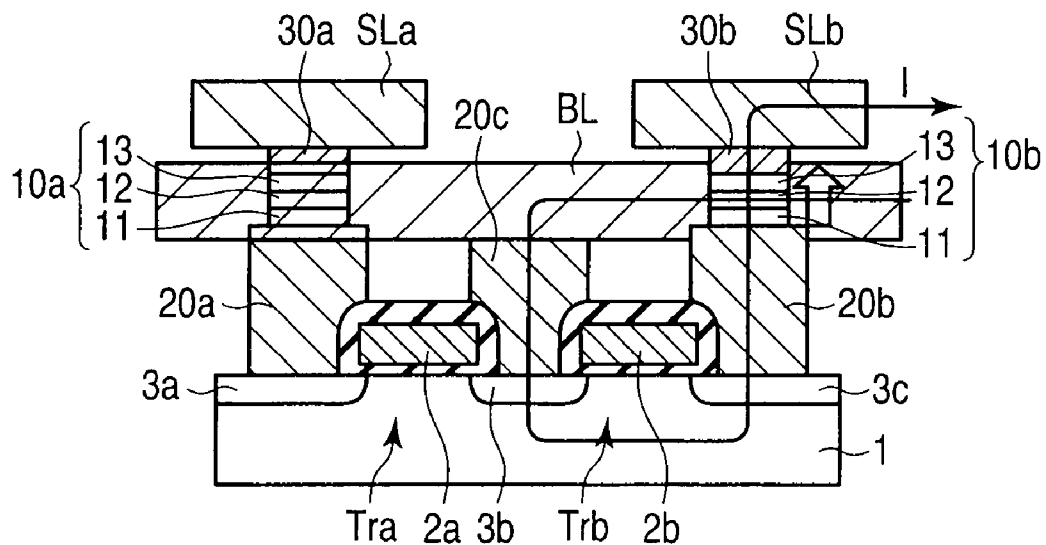
F I G. 14A
"1" Write (reference example 2)
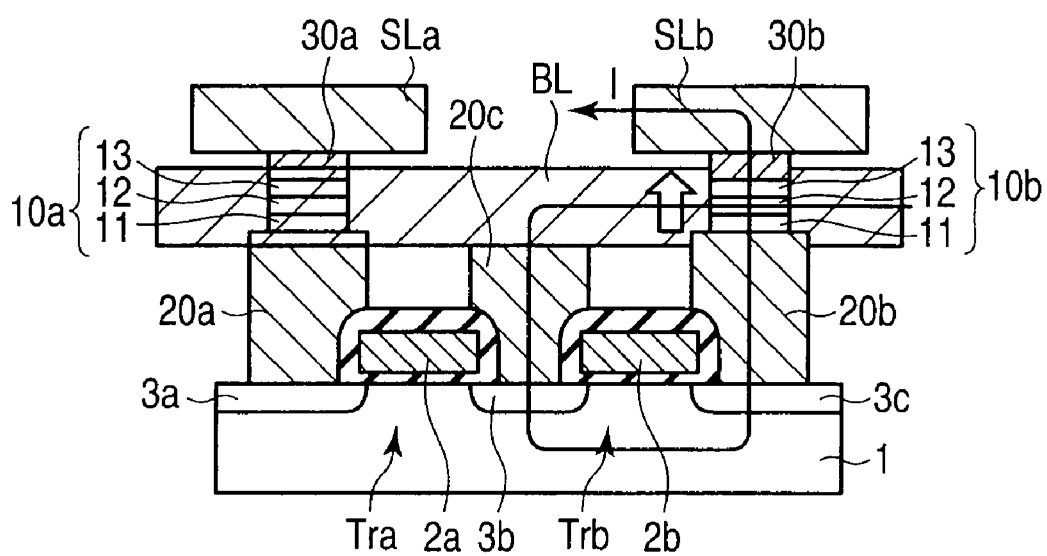
F I G. 14B "0" Write (reference example 2)
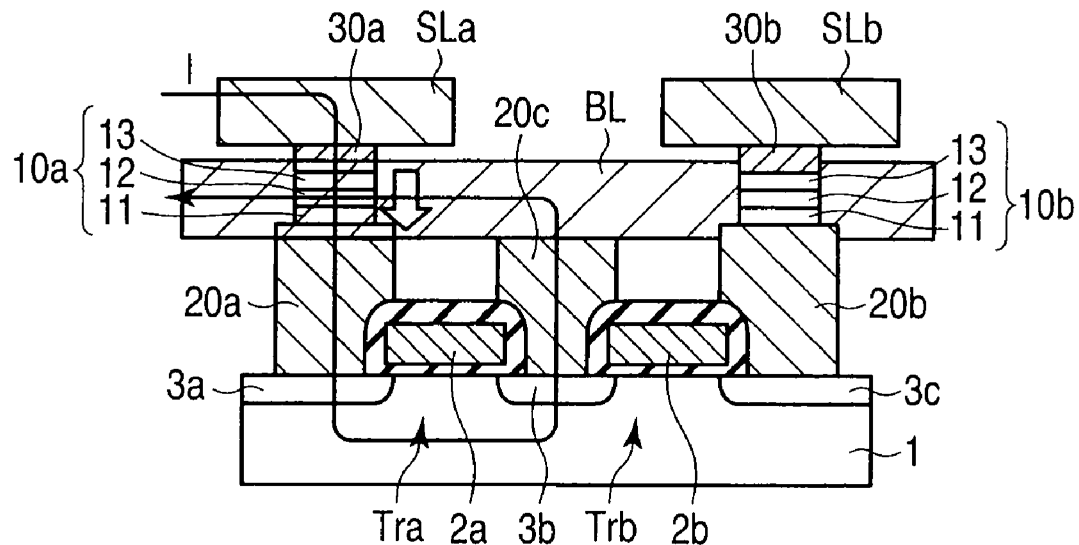
F I G. 15A
"0" Write (reference example 2)
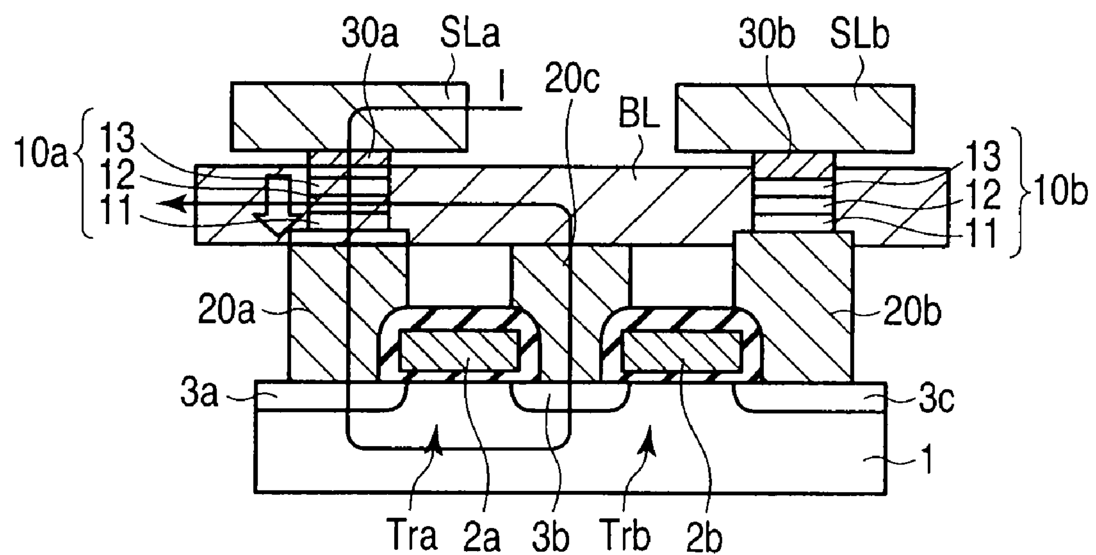
F I G. 15B "0" Write (reference example 2)

"0" Write (reference example 2)

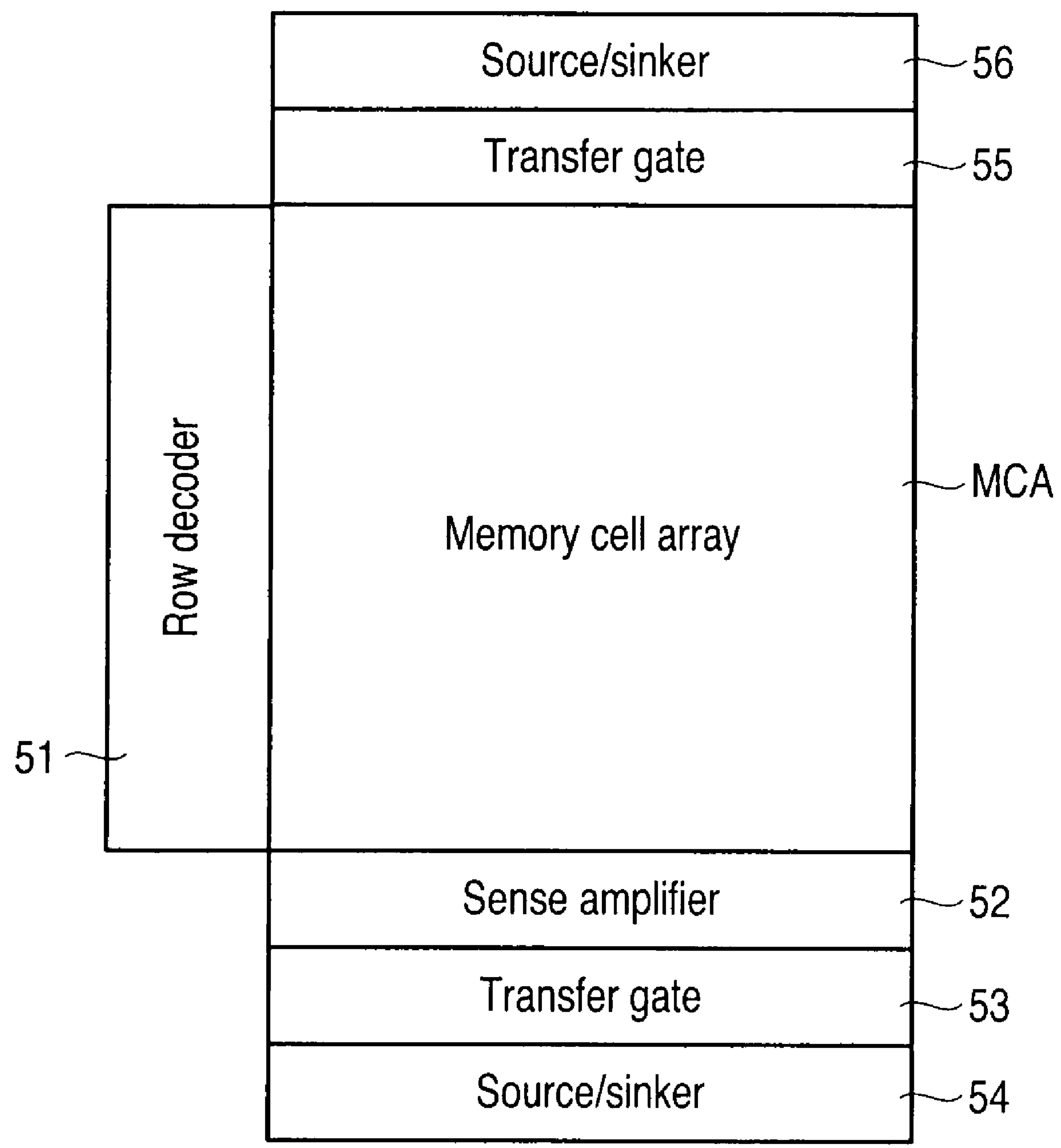
F I G. 17

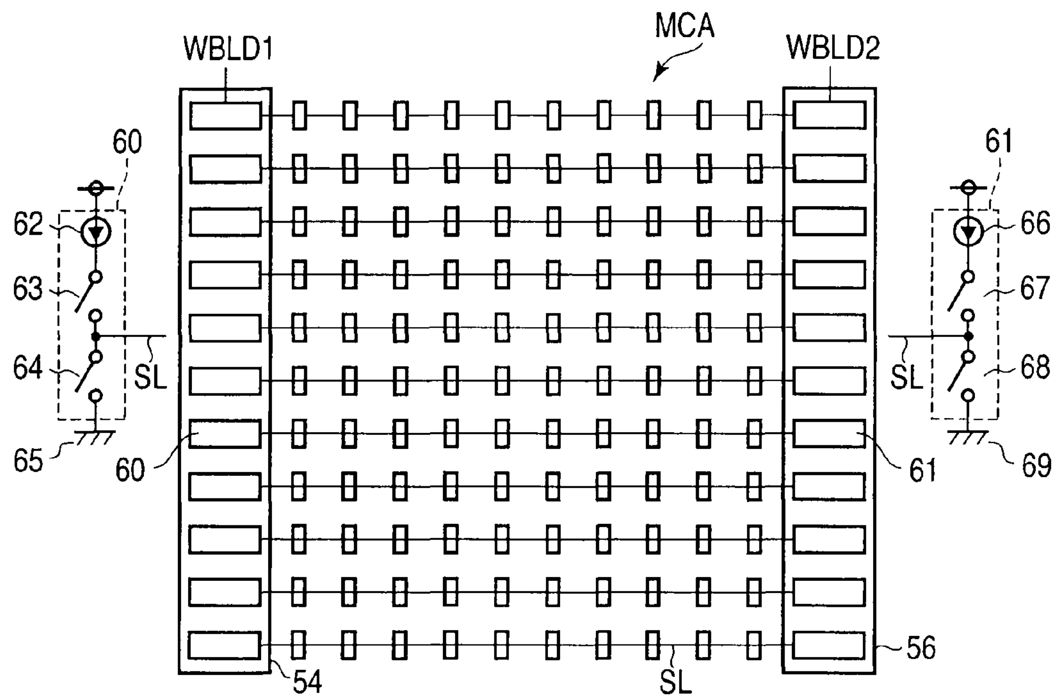
F I G. 18
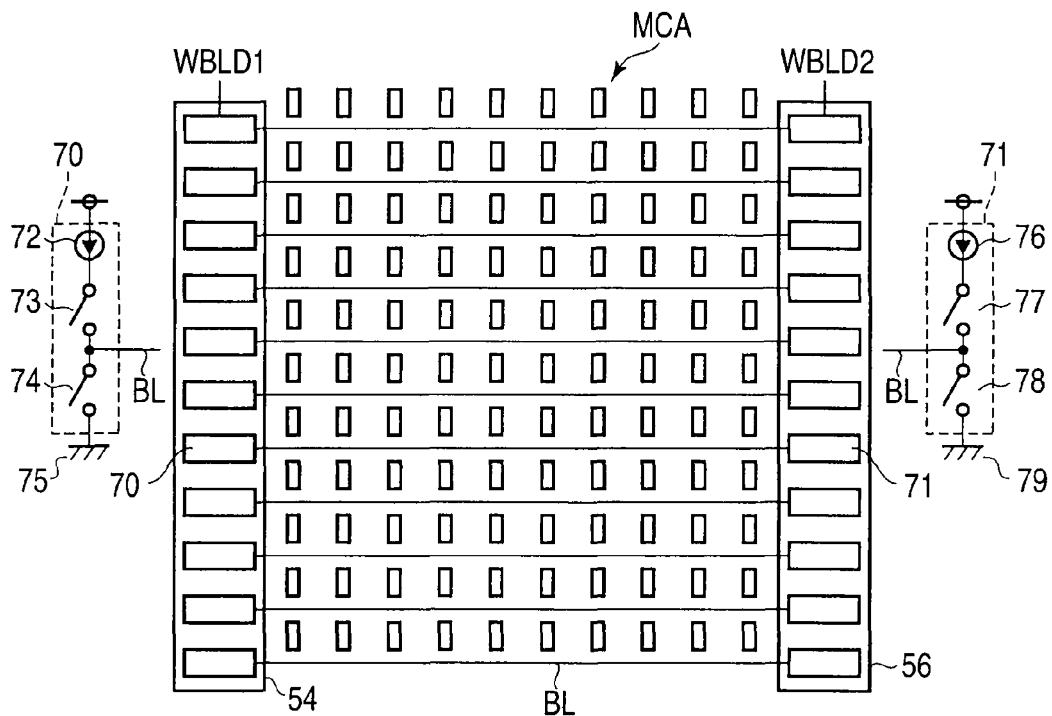
F I G. 19

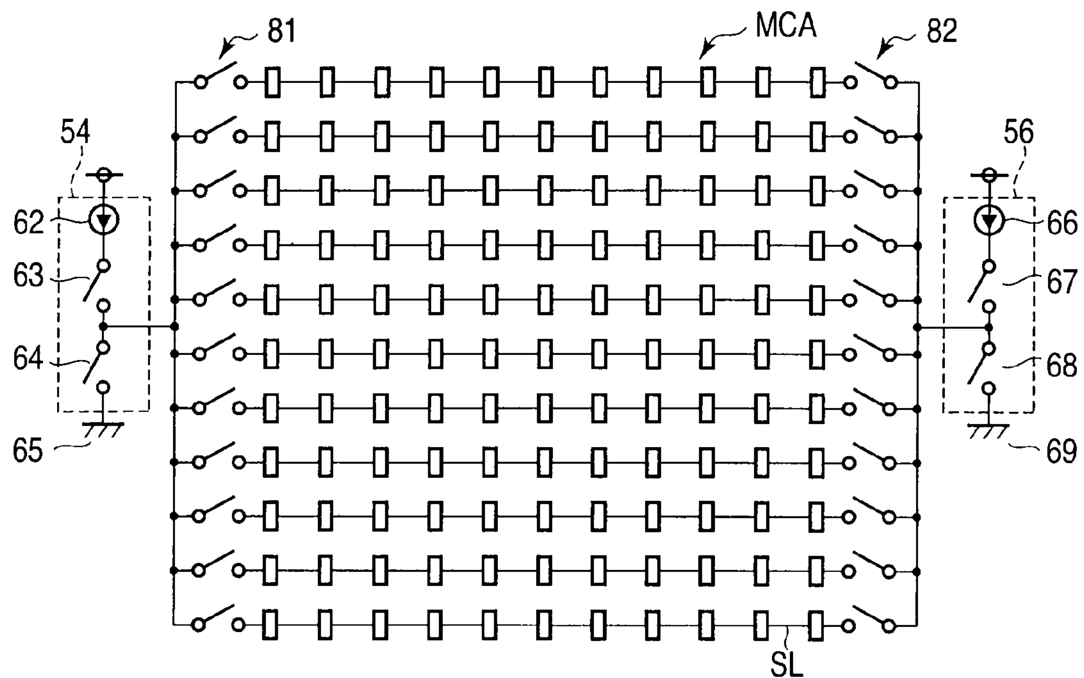
F I G. 20
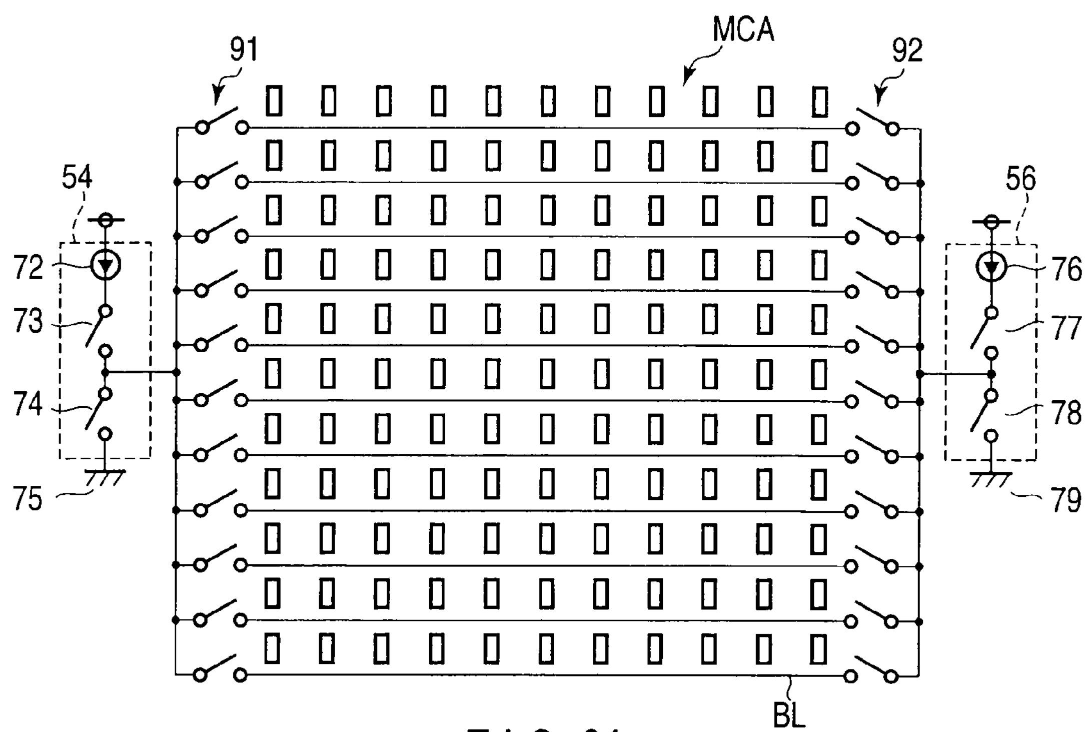
F I G. 21

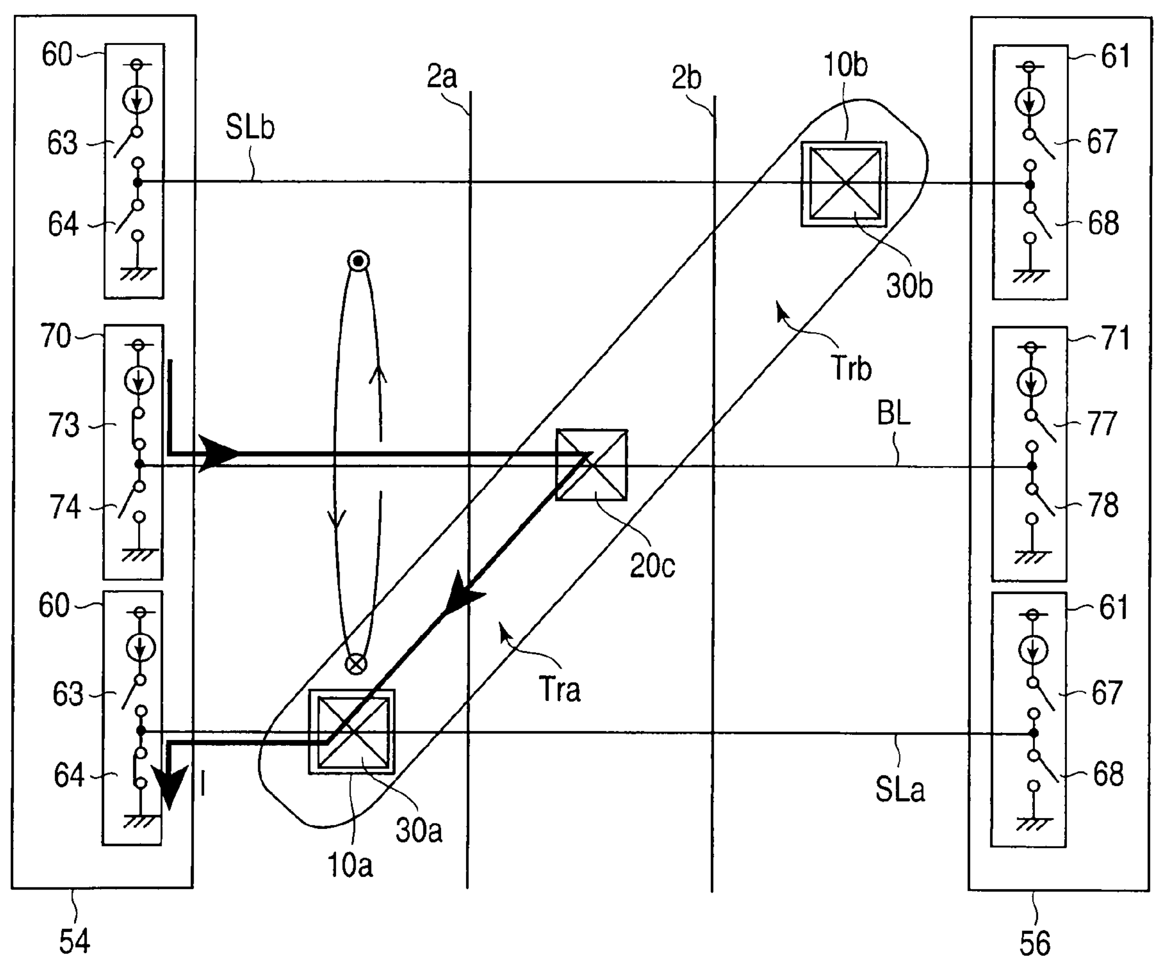
F I G. 22

MAGNETIC RANDOM ACCESS MEMORY AND WRITE METHOD OF THE SAME

CROSS-REFERENCE TO RELATED APPLICATIONS

This application is based upon and claims the benefit of priority from prior Japanese Patent Application No. 2007-326232, filed Dec. 18, 2007, the entire contents of which are incorporated herein by reference.

BACKGROUND OF THE INVENTION

1. Field of the Invention

The present invention relates to a spin transfer type magnetic random access memory and a write method of the same.

2. Description of the Related Art

A current-induced magnetic field write method and spin transfer torque write method have been proposed as magnetic random access memory write methods. In the spin transfer torque writing method, the reversal torque effect is small, so the effect of assisting a vector in another write direction of spin transfer may be necessary. Also, in the conventional spin transfer torque write method of performing magnetic field assist disclosed in, e.g., Jpn. Pat. Appln. KOKAI Publication No. 2006-286726, the number of interconnections increases because an interconnection for magnetic field assist is separately formed, or an area load is produced because the interconnection for magnetic field assist is enlarged. Consequently, the conventional magnetic field assisting method increases the chip cost.

BRIEF SUMMARY OF THE INVENTION

A magnetic random access memory according to the first aspect of the present invention comprising a magnetoresistive effect element including a fixed layer, a recording layer, and a nonmagnetic layer sandwiched between the fixed layer and the recording layer, magnetizations in the fixed layer and the recording layer being perpendicular to a film surface; a source line connected to one terminal of the magnetoresistive effect element; a transistor having a current path whose one end is connected to the other terminal of the magnetoresistive effect element; a bit line connected to the other end of the current path of the transistor, and running parallel to the source line; and a source/sinker which supplies a write current between the source line and the bit line via the magnetoresistive effect element and the transistor, a direction in which a magnetic field generated by the write current having passed through the bit line is applied to the magnetoresistive effect element being opposite to a direction of the write current passing through the magnetoresistive effect element.

A magnetic random access memory write method according to the second aspect of the present invention, the memory including a magnetoresistive effect element including a fixed layer, a recording layer, and a nonmagnetic layer sandwiched between the fixed layer and the recording layer, magnetizations in the fixed layer and the recording layer being perpendicular to a film surface; a source line connected to one terminal of the magnetoresistive effect element, a transistor having a current path whose one end is connected to the other terminal of the magnetoresistive effect element, and a bit line connected to the other end of the current path of the transistor, and running parallel to the source line, the method comprising supplying a write current between the source line and the bit line via the magnetoresistive effect element and the transistor, a direction in which a magnetic field generated by the write current having passed through the bit line is applied to the magnetoresistive effect element being opposite to a direction of the write current passing through the magnetoresistive effect element.

BRIEF DESCRIPTION OF THE SEVERAL VIEWS OF THE DRAWING

FIG. 2 is an exemplary view of memory cells in a region X shown in FIG. 1;

FIG. 3 is a view showing self-aligned formation of sidewall insulating films of an MTJ element and a bit line according to the embodiment of the present invention;

FIGS. 13A and 13B are exemplary views for explaining “1” write performed on the MTJ element **10*a*** by spin transfer according to reference example 2 of the present invention;

FIGS. 14A and 14B are exemplary views for explaining “1” write performed on the MTJ element **10*b*** by spin transfer according to reference example 2 of the present invention;

FIGS. 15A and 15B are exemplary views for explaining “0” write performed on the MTJ element **10*a*** by spin transfer according to reference example 2 of the present invention;

FIG. 17 is a view showing an outline of the layout of write-system core circuits according to the embodiment of the present invention;

FIG. 18 is a schematic view showing connection example 1 concerning source lines of the write-system core circuits according to the embodiment of the present invention;

FIG. 19 is a schematic view showing connection example 1 concerning bit lines of the write-system core circuits according to the embodiment of the present invention;

FIG. 20 is a schematic view showing connection example 2 concerning the source lines of the write-system core circuits according to the embodiment of the present invention;

FIG. 21 is a schematic view showing connection example 2 concerning the bit lines of the write-system core circuits according to the embodiment of the present invention;

FIG. 22 is an exemplary view for explaining a "1" write operation using the core circuits according to the embodiment of the present invention.

DETAILED DESCRIPTION OF THE INVENTION

Figure 1:
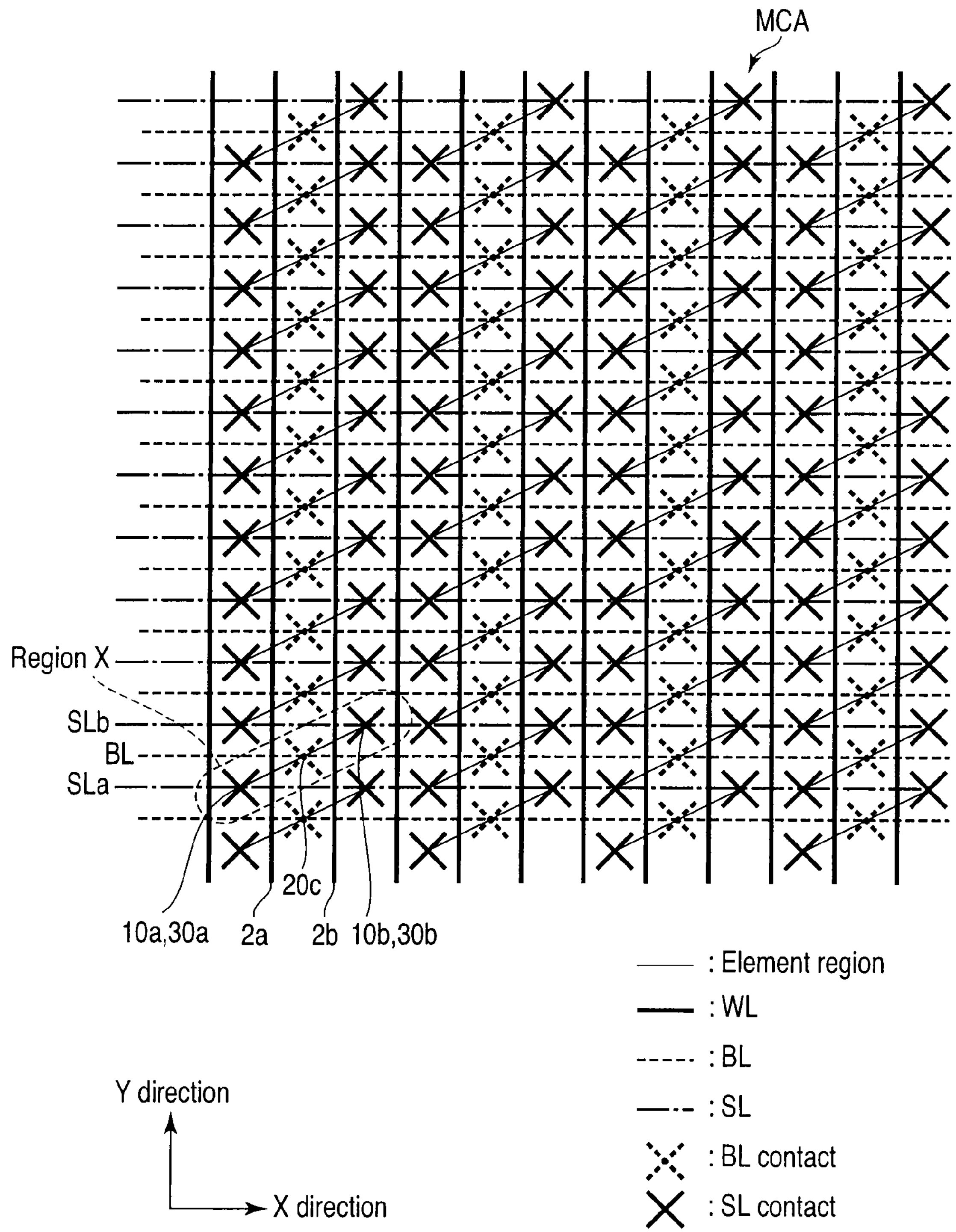
FIG. 1 is a view showing an exemplary layout of a memory cell array of a magnetic random access memory according to an embodiment of the present invention.

An embodiment of the present invention will be explained below with reference to the accompanying drawing. In the following explanation, the same reference numerals denote the same parts throughout the drawing.

[1] Layout of Memory Cell Array

FIG. 1 shows an exemplary layout of a memory cell array of a magnetic random access memory according to the embodiment of the present invention. The layout of the memory cell array of the magnetic random access memory of this embodiment will be explained below. Note that FIG. 1 shows a ⅓-pitch cell layout in order to form a minimum $6F^2$ cell from constituent elements of the MRAM.

In a memory cell array MCA as shown in FIG. 1, a plurality of bit lines BL and a plurality of source lines SL run parallel in the X direction such that the bit lines BL and source lines SL are alternately arranged parallel to the substrate surface. This is so because a high operating speed as the advantage of an MRAM cannot be obtained if the word-line direction (Y direction) or a common terminal of the substrate or the like is used because the number of cells that are charged and discharged upon application of a voltage increases. To achieve a high-speed memory, therefore, the arrangement as described above is desirably used.

A plurality of word lines WL run in the Y direction perpendicular to the bit lines BL and source lines SL. A source line contact is formed below the source line SL between two arbitrary word lines WL, and no bit line contact is formed below the bit line BL between the word lines WL. On the other hand, a bit line contact is formed below the bit line BL between two other arbitrary word lines WL, and no source line contact is formed below the source line SL between the word lines WL. That is, only the source line contacts are arranged along an arbitrary straight line in the Y direction, and only the bit line contacts are arranged along another straight line in the Y direction.

Element regions (active regions) run obliquely to the direction (X direction) in which the bit lines BL and source lines SL run. For example, the bit line contact is formed in the center of each element region, and the source line contacts are formed in the two ends of the element region.

An MTJ element is formed below the source line contact. The bit lines BL are arranged on the two sides (above and below on the drawing surface) of this MTJ element. MTJ elements using the same element region are connected to different source lines SL. In other words, MTJ elements connected to the same source line SL use different element regions.

Details of the layout of the memory cell array MCA as described above will be explained below by taking a region X shown in FIG. 1 as an example. The region X includes the regions of two cells.

Source lines SLa and SLb run in the X direction, and the bit line BL also runs in the X direction between the source lines SLa and SLb. The element region is formed obliquely to the X direction so as to extend across the source lines SLa and SLb. A bit line contact 20*c* is formed in the center of the element region. The bit line contact 20*c* connects the element region and bit line BL. Source line contacts 30*a* and 30*b* are formed in the two ends of the element region. The source line contact 30*a* connects the source line SLa and an MTJ element 10*a*, and the MTJ element 10*a* is connected to the element region. The source line contact 30*b* connects the source line SLb and an MTJ element 10*b*, and the MTJ element 10*b* is connected to the element region.

The world line WL (a gate electrode 2*a*) runs in the Y direction between the source line contact 30*a* and bit line contact 20*c*. The word line WL (a gate electrode 2*b*) runs in the Y direction between the source line contact 30*b* and bit line contact 20*c*. The word lines WL (gate electrodes 2*a* and 2*b*) intersect the bit line BL and source lines SLa and SLb.

[2] Structure of Memory Cell

FIG. 2 is an exemplary view of the memory cells in the region X shown in FIG. 1. The exemplary structure of the memory cells according to this embodiment will be explained below.

As shown in FIG. 2, the gate electrodes 2*a* and 2*b* are formed on a semiconductor substrate 1, and source/drain diffusion layers 3*a*, 3*b*, and 3*c* are formed in the semiconductor substrate 1 on the sides of the gate electrodes 2*a* and 2*b*. In this way, selection transistors (X'fer transistors) Tra and Trb are formed. In this embodiment, the two selection transistors Tra and Trb share the source/drain diffusion layer 3*b*.

A contact 20*a* is connected to the source/drain diffusion layer 3*a*, and the MTJ element 10*a* is formed on the contact 20*a*. The MTJ element 10*a* includes at least a fixed layer (pinned layer) 11, a recording layer (free layer) 13, and a nonmagnetic layer (tunnel insulating layer) 12 sandwiched between the fixed layer 11 and recording layer 13. In this embodiment, the recording layer 13 is formed above the fixed layer 11, and hence positioned closer to the source line SLa than the fixed layer 11. The source line contact 30*a* is formed on the MTJ element 10*a*, and the source line SLa is connected to the source line contact 30*a*.

A contact 20*b* is connected to the source/drain diffusion layer 3*c*, and the MTJ element 10*b* is formed on the contact 20*b*. The MTJ element 10*b* includes at least a fixed layer 11, a recording layer 13, and a nonmagnetic layer 12 sandwiched between the fixed layer 11 and recording layer 13. In this embodiment, the recording layer 13 is formed above the fixed layer 11, and hence positioned closer to the source line SLb than the fixed layer 11. The source line contact 30*b* is formed on the MTJ element 10*b*, and the source line SLb is connected to the source line contact 30*b*.

The bit line contact 20*c* is connected to the source/drain diffusion layer 3*b*, and the bit line BL is connected to the bit line contact 20*c*. The bit line BL runs behind the MTJ element 10*a* and before the MTJ element 10*b* on the drawing surface. In a ⅓-pitch $6F^2$ cell as in this embodiment, therefore, the two cells are arranged before and behind the bit line BL on the drawing surface around the bit line contact 20*c*.

The bit line BL desirably runs beside the MTJ elements 10*a* and 10*b* in order to efficiently apply a magnetic field generated by a write current flowing through the bit line BL to the MTJ element 10, thereby assisting magnetization reversal in the MTJ element 10.

The bit line BL is particularly preferably positioned beside the recording layers 13 of the MTJ elements 10*a* and 10*b*. More specifically, the bit line BL is favorably positioned such that the central point of the bit line BL in the film thickness direction matches that of the recording layer 13 in the film thickness direction. This makes it possible to apply an intense magnetic field to the recording layer 13, and increase the magnetic field assisting effect.

To further increase the effect that the magnetic field generated from the write current of the bit line BL has on the MTJ element 10, the MTJ element 10 and bit line BL are desirably formed as close as possible. As shown in FIG. 3, therefore, it is also possible to form sidewall insulating films 40 on the side surfaces of the MTJ element 10 and source line contact 30, and form the bit line BL in self-alignment with the sidewall insulating film 40. Consequently, the bit line BL is in direct contact with the sidewall insulating film 40. This makes it possible to shorten the distance between the bit line BL and MTJ element 10 to about the film thickness of the sidewall insulating film 40.

[3] Write Methods

[3-1] Spin Transfer Torque Write

Figure 4A:
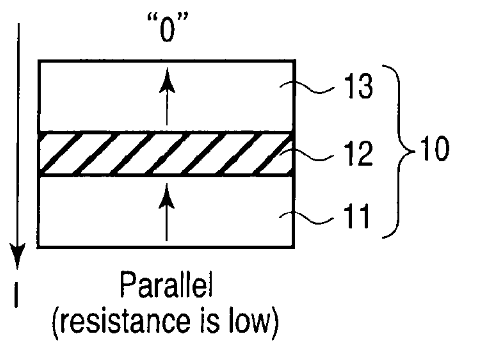
FIGS. 4A and 4B are views for explaining spin transfer torque write according to the embodiment of the present invention.
Figure 4B:
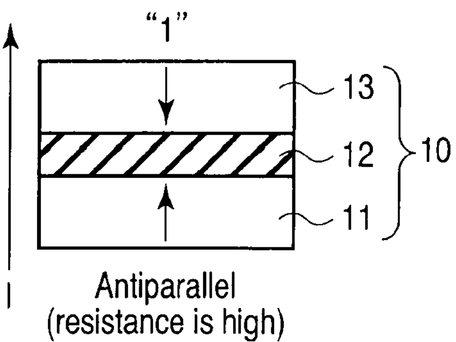

FIGS. 4A and 4B are views for explaining spin transfer torque write according to the embodiment of the present invention. An outline of the spin transfer torque write used in this embodiment will be explained below.

The MTJ element 10 takes a parallel state in which the magnetization directions in the fixed layer 11 and recording layer 13 are parallel (the same), and an antiparallel state in which the magnetization directions in the fixed layer 11 and recording layer 13 are antiparallel (opposite). In this embodiment, the parallel state is defined as state "0", and the antiparallel state is defined as state "1". Note that it is of course also possible to make the two values each correspond to the other one of the two magnetization configurations of the MTJ element 10.

As shown in FIG. 4A, when setting the magnetization of the MTJ element 10 in state "0", i.e., when reversing the magnetization in the recording layer 13 which is antiparallel to the magnetization direction in the fixed layer 11, thereby making the former parallel to the latter, an electric current I is supplied from the recording layer 13 to the fixed layer 11. That is, electrons are supplied from the fixed layer 11 to the recording layer 13. This makes the magnetization directions in the fixed layer 11 and recording layer 13 of the MTJ element 10 parallel. This case is a low-resistance state in which the tunnel resistance of the nonmagnetic layer 12 is lowest.

On the other hand, as shown in FIG. 4B, when setting the magnetization of the MTJ element 10 in state "1", i.e., when reversing the magnetization in the recording layer 13 which is parallel to the magnetization direction in the fixed layer 11, thereby making the former antiparallel to the latter, the electric current I is supplied from the fixed layer 11 to the recording layer 13. That is, electrons are supplied from the recording layer 13 to the fixed layer 11. This makes the magnetization directions in the fixed layer 11 and recording layer 13 of the MTJ element 10 antiparallel. This case is a high-resistance state in which the tunnel resistance of the nonmagnetic layer 12 is highest.

[3-2] Practical Examples

In this embodiment, spin transfer torque write described above is performed using the perpendicular magnetization type MTJ element 10. In this case, the write current I flows through the MTJ element 10 and returns through the bit line BL, or flows through the bit line BL and returns through the MTJ element 10. Accordingly, the write current I having passed through the bit line BL beside the MTJ element 10 generates a perpendicular magnetic field, so this magnetic field can be applied to the MTJ element 10. The application direction of the magnetic field is made opposite to the direction of the write current I flowing through the MTJ element 10. That is, the magnetic field generated by the write current is applied in the same direction as that of electrons flowing through the MTJ element 10, thereby assisting magnetization reversal caused in the recording layer 13 by spin transfer torque.

The write method of this embodiment as described above desirably satisfies two write conditions (1) and (2) below.

(1) The write current I flows through the bit line BL positioned beside the MTJ element 10 as an object of write.

(2) The magnetic field generated by the write current I meeting write condition (1) above is applied in the direction opposite to that of the write current I flowing through the MTJ element 10 as an object of write.

Practical write methods of this embodiment meeting write conditions (1) and (2) described above will be explained below.

("1" Write)

"1" write by spin transfer according to the embodiment of the present invention will be explained below with reference to FIGS. 5A and 5B and 6A and 6B. Note that in each drawing, the MTJ element 10*a* exists before the bit line BL, and the MTJ element 10*b* exists behind the bit line BL. Note also that the solid arrow indicates the direction of the write current I, and the hollow arrow indicates the application direction of the magnetic field generated by the write current I.

First, the case where "1" is written in the MTJ element 10*a* will be explained with reference to FIGS. 5A and 5B. To write "1", i.e., to make the magnetization directions in the fixed layer 11 and recording layer 13 antiparallel, the write current I must be supplied from the fixed layer 11 to the recording layer 13. Accordingly, the write current I is supplied in the order of the bit line BL, bit line contact 20*c*, transistor Tra, contact 20*a*, MTJ element 10*a*, source line contact 30*a*, and source line SLa.

The example shown in FIGS. 5A and 5B meets the two write conditions described above as follows. The write current I flows through the bit line BL positioned beside (behind) the MTJ element 10*a* as an object of write (condition (1)). Also, the magnetic field generated by the write current I having passed through the bit line BL is applied in the direction opposite to that of the write current I flowing through the MTJ element 10*a* (condition (2)). More specifically, while the magnetic field is applied downward on the drawing surface from the recording layer 13 to the fixed layer 11, the write current I flows upward on the drawing surface from the fixed layer 11 to the recording layer 13.

Figure 5A:
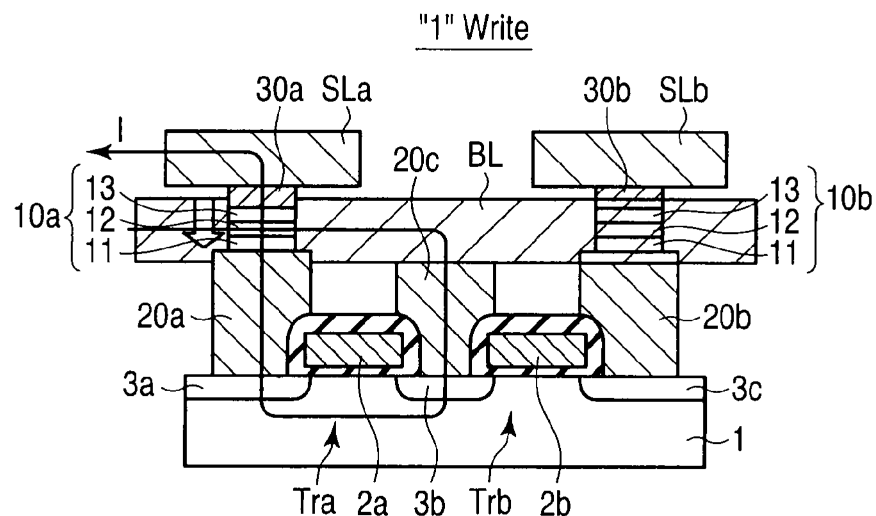
FIGS. 5A and 5B are exemplary views for explaining “1” write performed on an MTJ element **10*a*** by spin transfer according to the embodiment of the present invention.
Figure 5B:
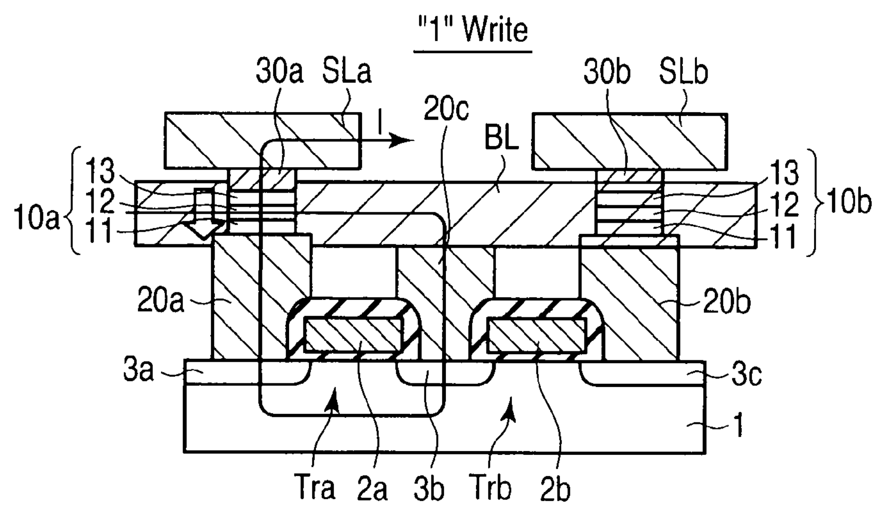

Note that the write current I flowing to the source line SLa through the MTJ element 10*a* can flow in the direction of the current source of the bit line BL (leftward on the drawing surface) as shown in FIG. 5A, or in the direction opposite to the current source of the bit line BL (rightward on the drawing surface) as shown in FIG. 5B.

Next, the case where "1" is written in the MTJ element 10*b* will be explained with reference to FIGS. 6A and 6B. To write "1", the write current I is supplied in the order of the bit line BL, bit line contact 20*c*, transistor Trb, contact 20*b*, MTJ element 10*b*, source line contact 30*b*, and source line SLb.

The example shown in FIGS. 6A and 6B meets the two write conditions described above as follows. The write current I flows through the bit line BL positioned beside (before) the MTJ element 10*b* as an object of write (condition (1)). Also, the magnetic field generated by the write current I having passed through the bit line BL is applied in the direction opposite to that of the write current I flowing through the MTJ element 10*b* (condition (2)). More specifically, while the magnetic field is applied downward on the drawing surface from the recording layer 13 to the fixed layer 11, the write current I flows upward on the drawing surface from the fixed layer 11 to the recording layer 13.

Figure 6A:
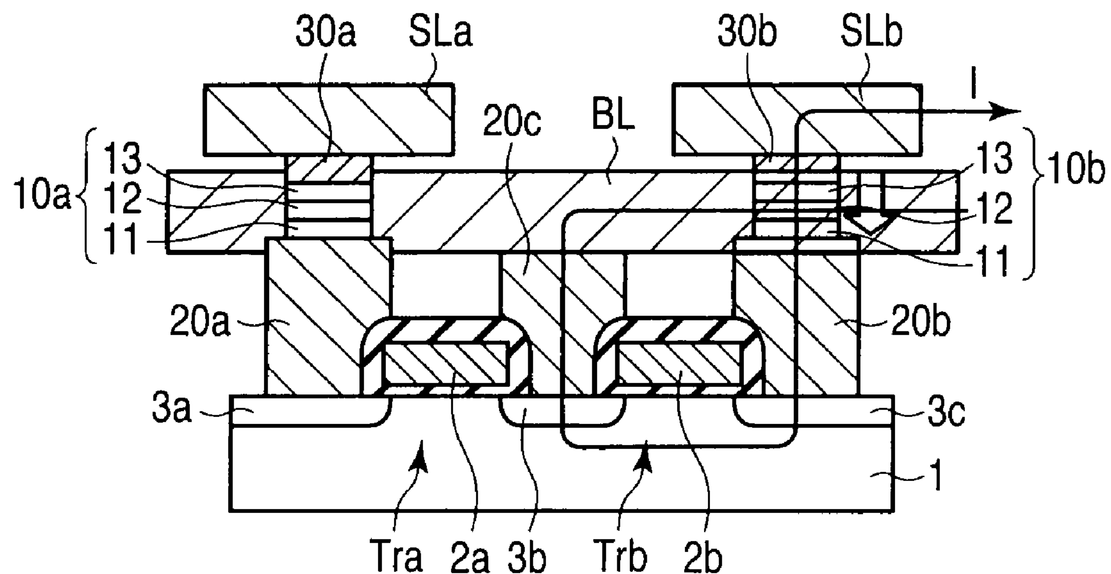
FIGS. 6A and 6B are exemplary views for explaining “1” write performed on an MTJ element **10*b*** by spin transfer according to the embodiment of the present invention.
Figure 6B:
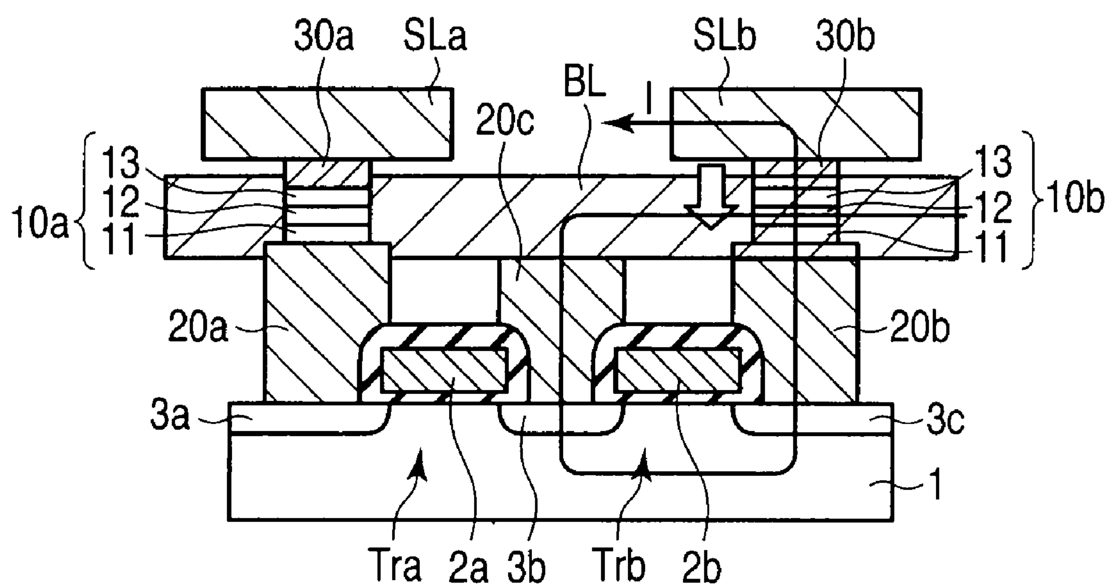

Note that the write current I flowing to the source line SLb through the MTJ element 10*b* can flow in the direction of the current source of the bit line BL (rightward on the drawing surface) as shown in FIG. 6A, or in the direction opposite to the current source of the bit line BL (leftward on the drawing surface) as shown in FIG. 6B.

("0" Write)

"0" write by spin transfer according to the embodiment of the present invention will be explained below with reference to FIGS. 7A and 7B and 8A and 8B. Note that in each drawing, the MTJ element 10*a* exists before the bit line BL, and the MTJ element 10*b* exists behind the bit line BL. Note also that the solid arrow indicates the direction of the write current I, and the hollow arrow indicates the application direction of the magnetic field generated by the write current I.

First, the case where "0" is written in the MTJ element 10*a* will be explained with reference to FIGS. 7A and 7B. To write "0", i.e., to make the magnetization directions in the fixed layer 11 and recording layer 13 parallel, the write current I must be supplied from the recording layer 13 to the fixed layer 11. Accordingly, the write current I is supplied in the order of the source line SLa, source line contact 30*a*, MTJ element 10*a*, contact 20*a*, transistor Tra, bit line contact 20*c*, and bit line BL.

The example shown in FIGS. 7A and 7B meets the two write conditions described above as follows. The write current I flows through the bit line BL positioned beside (behind) the MTJ element 10*a* as an object of write (condition (1)). Also, the magnetic field generated by the write current I having passed through the bit line BL is applied in the direction opposite to that of the write current I flowing through the MTJ element 10*a* (condition (2)). More specifically, while the magnetic field is applied upward on the drawing surface from the fixed layer 11 to the recording layer 13, the write current I flows downward on the drawing surface from the recording layer 13 to the fixed layer 11.

Figure 7A:
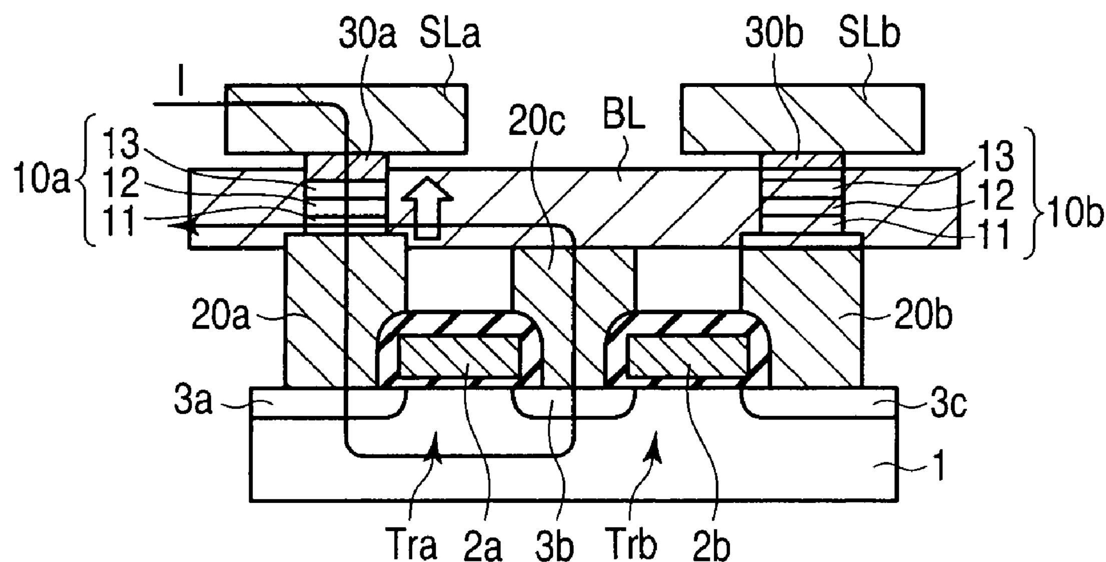
FIGS. 7A and 7B are exemplary views for explaining “0” write performed on the MTJ element **10*a*** by spin transfer according to the embodiment of the present invention.
Figure 7B:
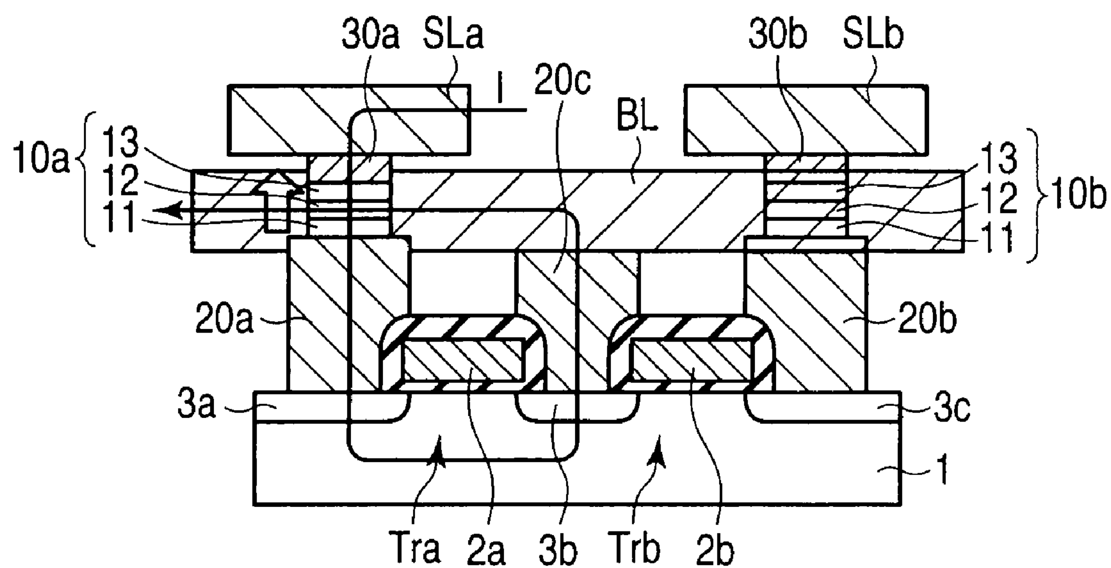

Note that the write current I flowing through the source line SLa can flow out in the direction of the ground of the bit line BL as shown in FIG. 7A, or in the direction opposite to the ground of the bit line BL as shown in FIG. 7B.

Next, the case where "0" is written in the MTJ element 10*b* will be explained with reference to FIGS. 8A and 8B. To write "0", the write current I is supplied in the order of the source line SLb, source line contact 30*b*, MTJ element 10*b*, contact 20*b*, transistor Trb, bit line contact 20*c*, and bit line BL.

The example shown in FIGS. 8A and 8B meets the two write conditions described above as follows. The write current I flows through the bit line BL positioned beside (before) the MTJ element 10*b* as an object of write (condition (1)). Also, the magnetic field generated by the write current I having passed through the bit line BL is applied in the direction opposite to that of the write current I flowing through the MTJ element 10*b* (condition (2)). More specifically, while the magnetic field is applied upward on the drawing surface from the fixed layer 11 to the recording layer 13, the write current I flows downward on the drawing surface from the recording layer 13 to the fixed layer 11.

Figure 8A:
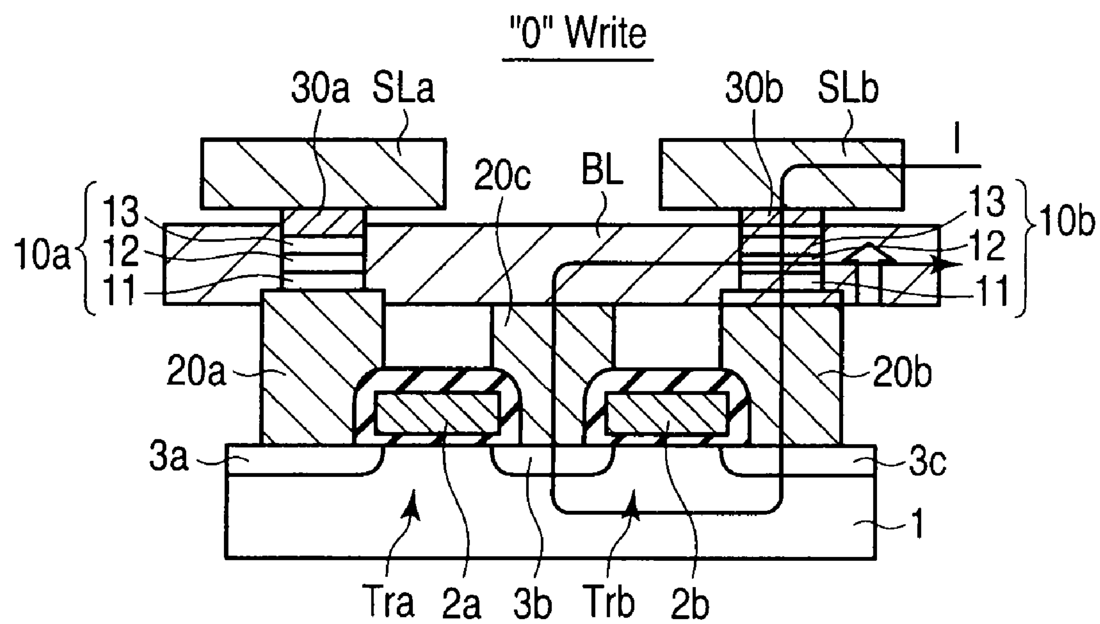
FIGS. 8A and 8B are exemplary views for explaining “0” write performed on the MTJ element **10*b*** by spin transfer according to the embodiment of the present invention.
Figure 8B:
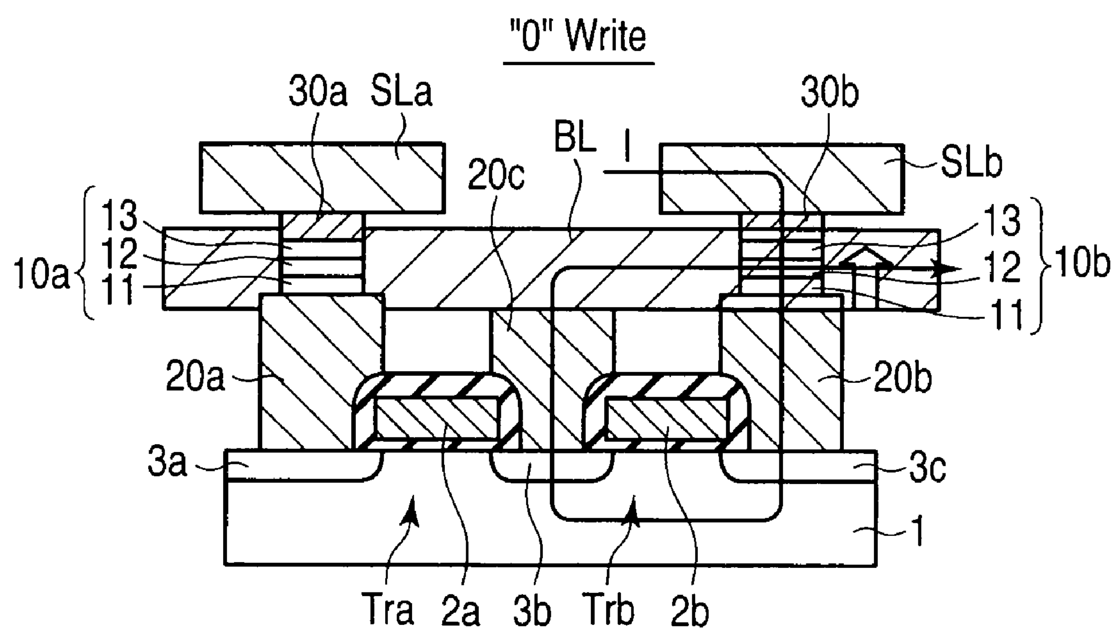

Note that the write current I flowing through the source line SLb can flow out in the direction of the ground of the bit line BL as shown in FIG. 8A, or in the direction opposite to the ground of the bit line BL as shown in FIG. 8B.

[3-3] Reference Example 1

FIGS. 9A and 9B to 12A and 12B illustrate reference example 1 that does not satisfy write condition (1). Note that in each drawing, the MTJ element 10*a* exists before the bit line BL, and the MTJ element 10*b* exists behind the bit line BL. Note also that the solid arrow indicates the direction of the write current I, and the hollow arrow indicates the application direction of the magnetic field generated by the write current I.

In reference example 1, no write current I flows through the bit line BL positioned beside the MTJ element 10*a* or 10*b* as an object of write, so no satisfactory magnetic field assisting effect can be obtained. Details are as follows.

Figure 9A:
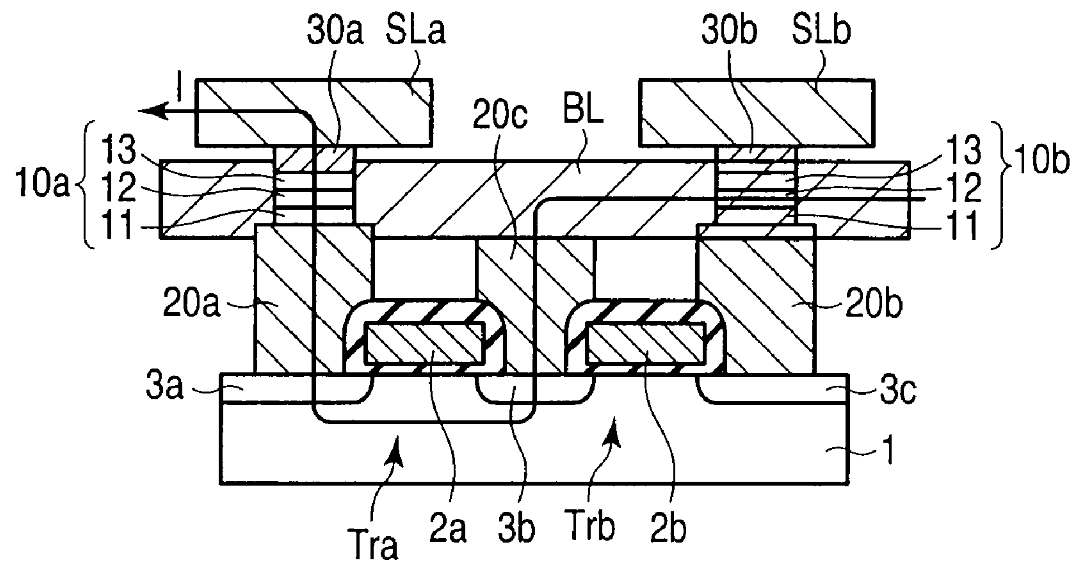
FIGS. 9A and 9B are exemplary views for explaining “1” write performed on the MTJ element **10*a*** by spin transfer according to reference example 1 of the present invention.
Figure 9B:
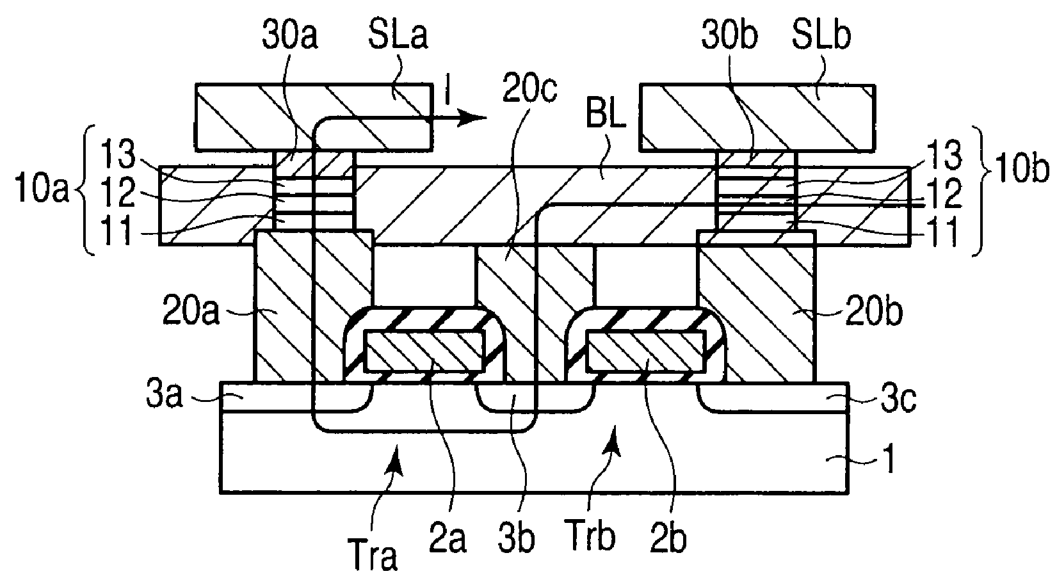

In the case shown in FIGS. 9A and 9B, the write current I is supplied from the fixed layer 11 to the recording layer 13 in order to write "1" in the MTJ element 10*a*. However, the write current I on the bit line BL flows beside the MTJ element 10*b* that is not an object of write, and does not flow beside the MTJ element 10*a*.

Figure 10A:
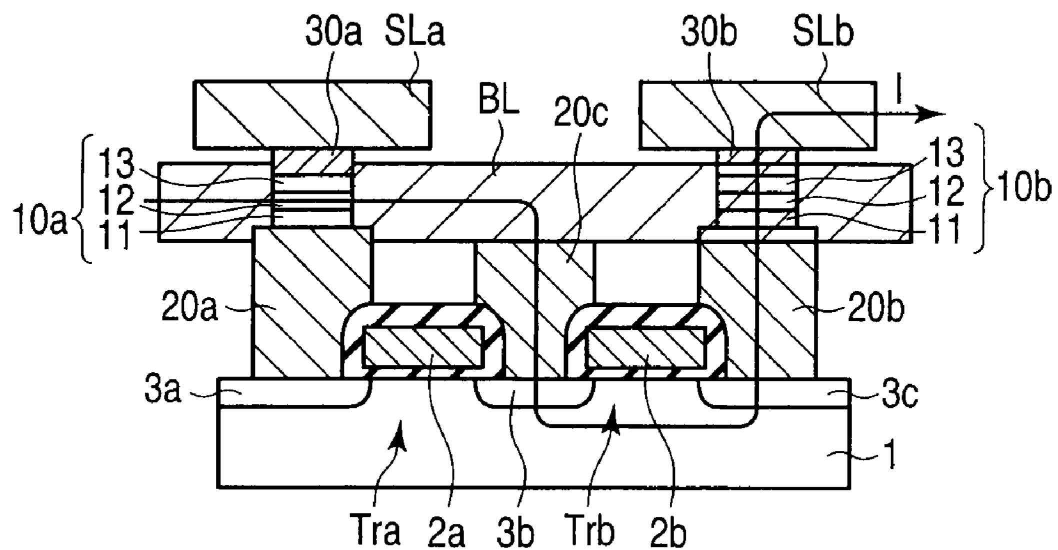
FIGS. 10A and 10B are exemplary views for explaining “1” write performed on the MTJ element **10*b*** by spin transfer according to reference example 1 of the present invention.
Figure 10B:
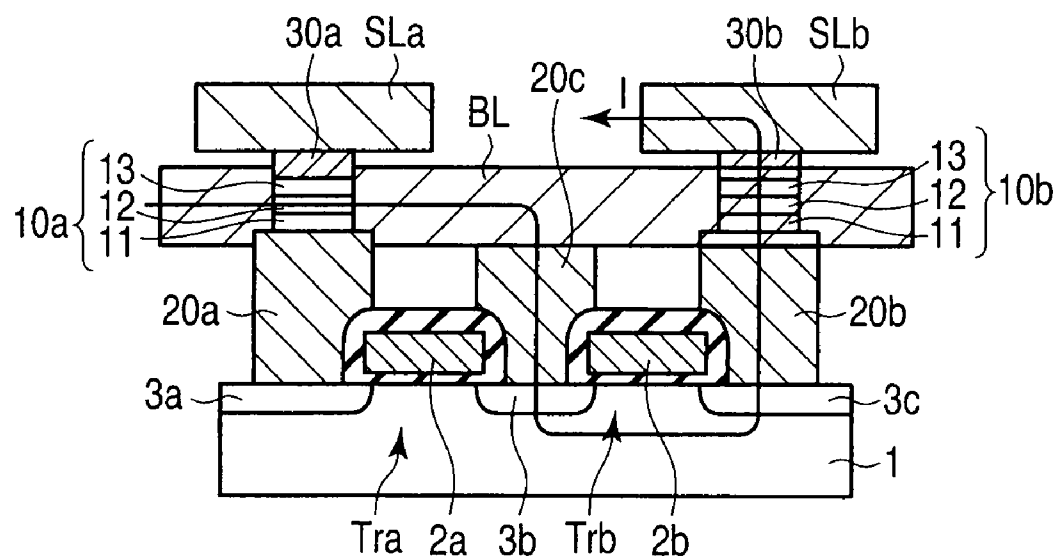

In the case shown in FIGS. 10A and 10B, the write current I is supplied from the fixed layer 11 to the recording layer 13 in order to write "1" in the MTJ element 10*b*. However, the write current I on the bit line BL flows beside the MTJ element 10*a* that is not an object of write, and does not flow beside the MTJ element 10*b*.

Figure 11A:
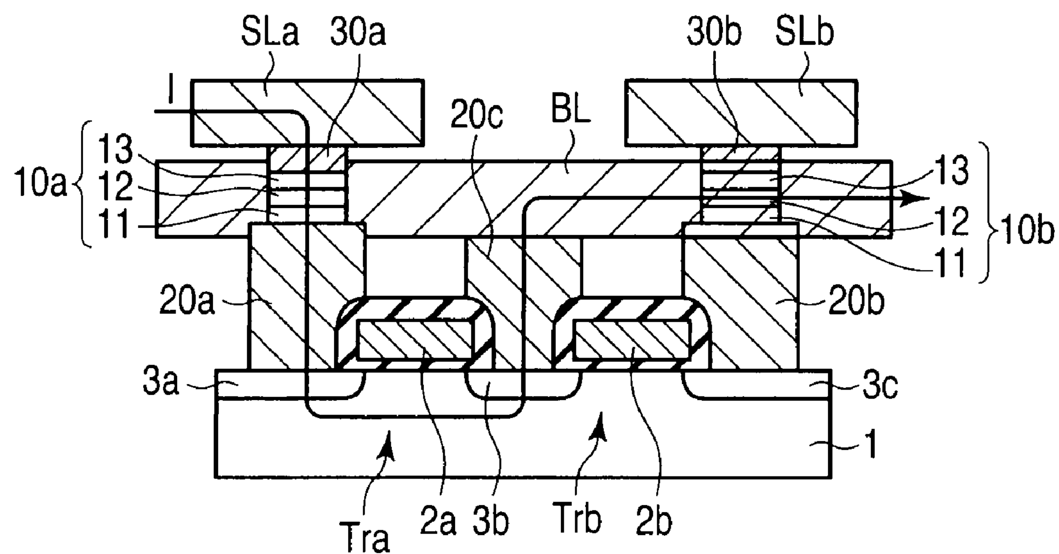
FIGS. 11A and 11B are exemplary views for explaining “0” write performed on the MTJ element **10*a*** by spin transfer according to reference example 1 of the present invention.
Figure 11B:
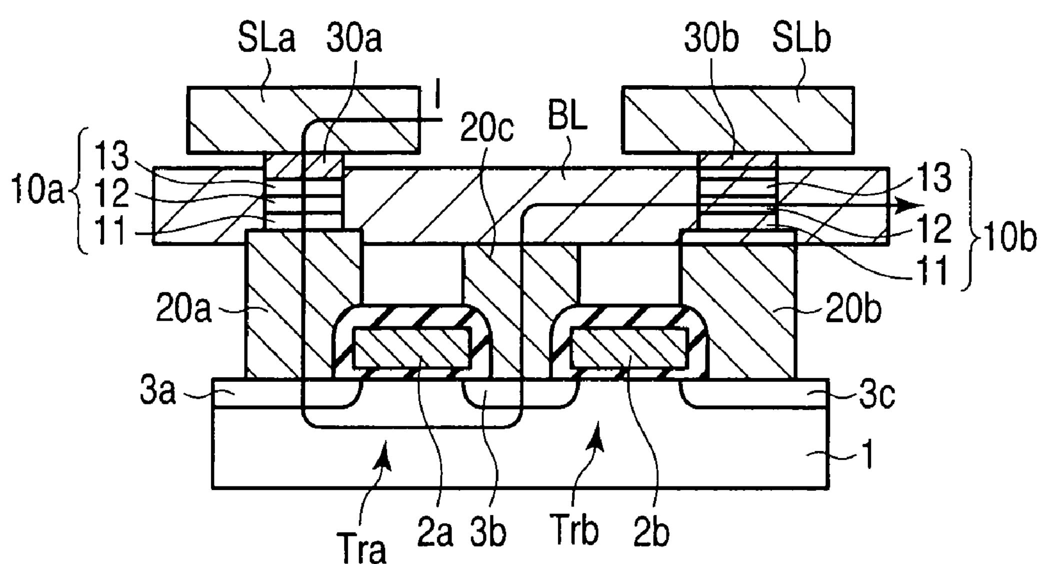

In the case shown in FIGS. 11A and 11B, the write current I is supplied from the recording layer 13 to the fixed layer 11 in order to write "0" in the MTJ element 10*a*. However, the write current I on the bit line BL flows beside the MTJ element 10*b* that is not an object of write, and does not flow beside the MTJ element 10*a*.

Figure 12A:
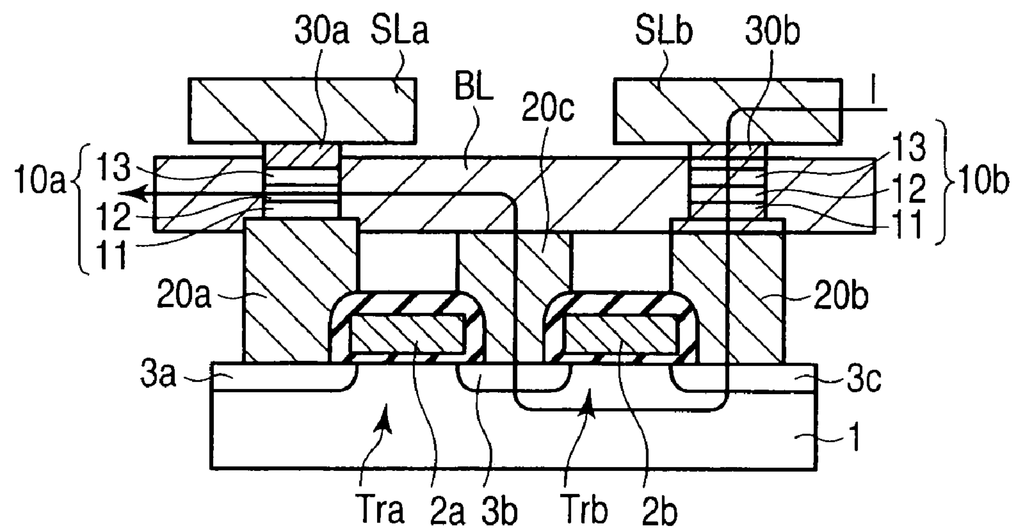
FIGS. 12A and 12B are exemplary views for explaining “0” write performed on the MTJ element **10*b*** by spin transfer according to reference example 1 of the present invention.
Figure 12B:
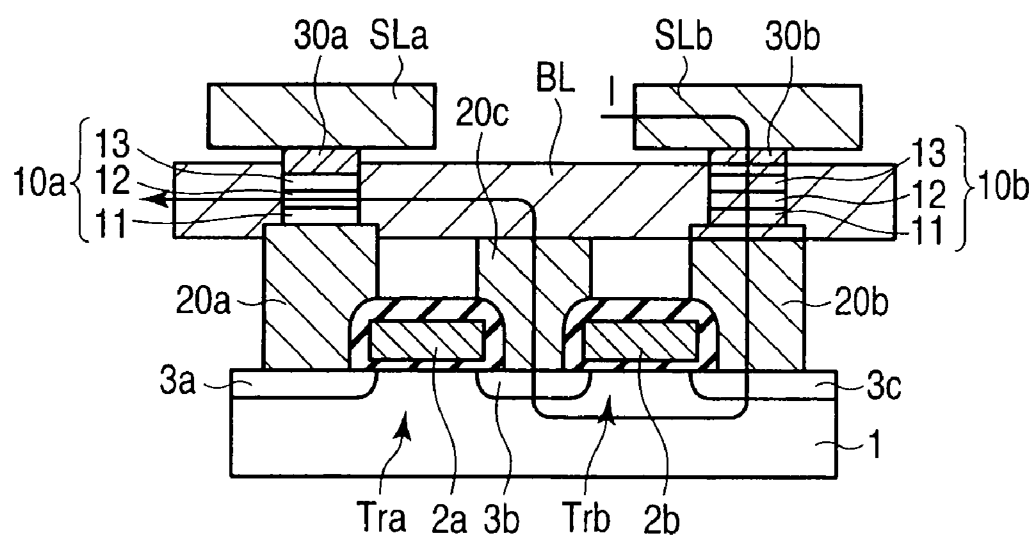

In the case shown in FIGS. 12A and 12B, the write current I is supplied from the recording layer 13 to the fixed layer 11 in order to write "0" in the MTJ element 10*b*. However, the write current I on the bit line BL flows beside the MTJ element 10*a* that is not an object of write, and does not flow beside the MTJ element 10*b*.

In reference example 1 as described above, no write current I flows through the bit line BL positioned beside the MTJ element 10*a* or 10*b* as an object of write. Even when a magnetic field is generated by the write current I, therefore, this magnetic field cannot be efficiently applied to the MTJ element 10*a* or 10*b* as an object. Accordingly, no satisfactory magnetic field assisting effect can be obtained by reference example 1 that does not satisfy write condition (1).

[3-4] Reference Example 2

FIGS. 13A and 13B to 16A and 16B illustrate reference example 2 that does not satisfy write condition (2). Note that in each drawing, the MTJ element 10*a* exists behind the bit line BL, and the MTJ element 10*b* exists before the bit line BL. Note also that the solid arrow indicates the direction of the write current I, and the hollow arrow indicates the application direction of the magnetic field generated by the write current I.

In reference example 2, when the write current I flows through the bit line BL positioned beside the MTJ element 10_a_ or 10_b_ as an object of write, the magnetic field generated by the write current I is applied in the same direction as that of the write current I flowing through the MTJ element 10_a_ or 10_b_ as an object of write. As a consequence, no satisfactory magnetic field assisting effect can be obtained. Details are as follows.

In the case shown in FIGS. 13A and 13B, the write current I is supplied from the fixed layer 11 to the recording layer 13 in order to write "1" in the MTJ element 10_a_. However, the magnetic field generated by the write current I flowing through the bit line BL beside the MTJ element 10_a_ is applied from the fixed layer 11 to the recording layer 13. That is, the application direction of the magnetic field is the same as the direction of the write current I flowing through the MTJ element 10_a_.

In the case shown in FIGS. 14A and 14B, the write current I is supplied from the fixed layer 11 to the recording layer 13 in order to write "1" in the MTJ element 10_b_. However, the magnetic field generated by the write current I flowing through the bit line BL beside the MTJ element 10_b_ is applied from the fixed layer 11 to the recording layer 13. That is, the application direction of the magnetic field is the same as the direction of the write current I flowing through the MTJ element 10_b_.

In the case shown in FIGS. 15A and 15B, the write current I is supplied from the recording layer 13 to the fixed layer 11 in order to write "0" in the MTJ element 10_a_. However, the magnetic field generated by the write current I flowing through the bit line BL beside the MTJ element 10_a_ is applied from the recording layer 13 to the fixed layer 11. That is, the application direction of the magnetic field is the same as the direction of the write current I flowing through the MTJ element 10_a_.

Figure 16A:
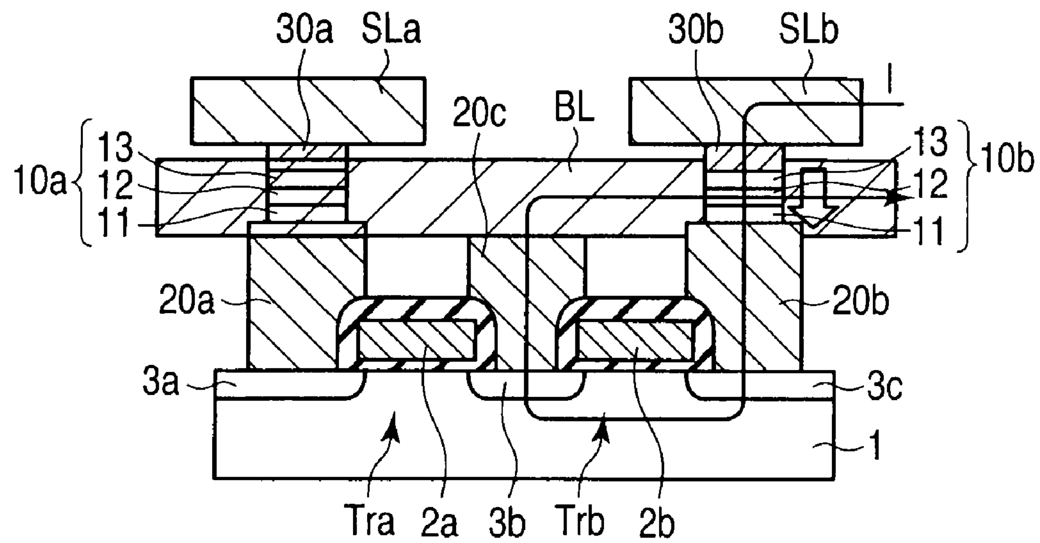
FIGS. 16A and 16B are exemplary views for explaining “0” write performed on the MTJ element **10*b*** by spin transfer according to reference example 2 of the present invention.
Figure 16B:
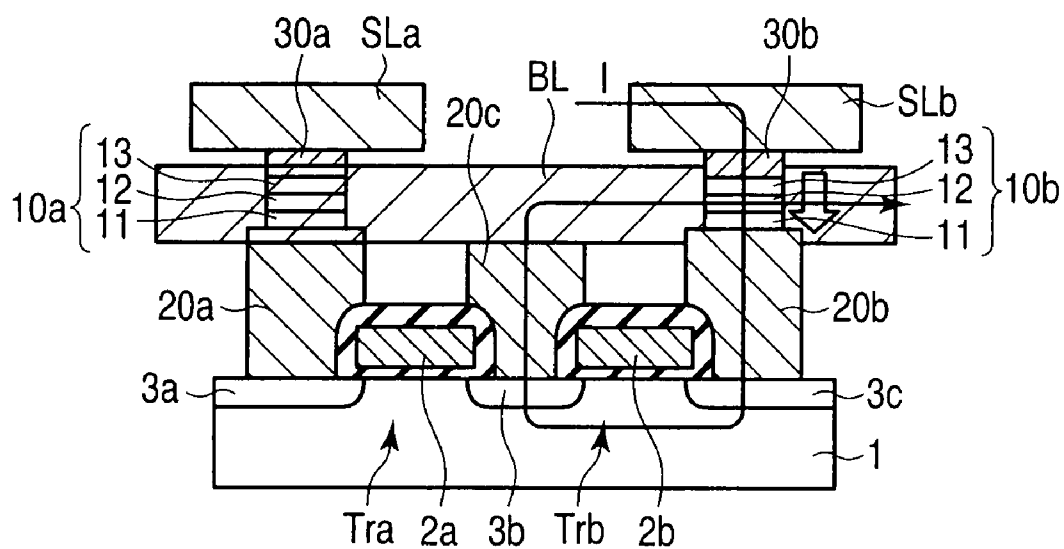

In the case shown in FIGS. 16A and 16B, the write current I is supplied from the recording layer 13 to the fixed layer 11 in order to write "0" in the MTJ element 10_b_. However, the magnetic field generated by the write current I flowing through the bit line BL beside the MTJ element 10_b_ is applied from the recording layer 13 to the fixed layer 11. That is, the application direction of the magnetic field is the same as the direction of the write current I flowing through the MTJ element 10_b_.

In reference example 2 as described above, the application direction of the magnetic field is the same as the direction of the write current I flowing through the MTJ element 10_a_ or 10_b_ as an object of write. In other words, the application direction of the magnetic field is opposite to the direction of electrons (the direction of spin). That is, the magnetic field is applied in a direction to interfere with magnetization reversal caused in the recording layer 13 by spin transfer torque. Accordingly, no magnetic field assisting effect can be obtained by reference example 2 that does not satisfy write condition (2).

[4] Write-System Core Circuits

[4-1] Layout

FIG. 17 is a view showing an outline of the layout of write-system core circuits according to the embodiment of the present invention. The outline of the layout of the write-system core circuits according to the embodiment of the present invention will be explained below.

As shown in FIG. 17, the core circuits are arranged around the memory cell array MCA. The core circuits include a row decoder 51, a sense amplifier 52, transfer gates 53 and 55, and sources/sinkers 54 and 56.

The row decoder 51 is positioned on the left side of the memory cell array MCA on the drawing surface, and connected to the word lines WL. The sense amplifier 52 is positioned below the memory cell array MCA on the drawing surface, and connected to the source lines SL. The transfer gates 53 and 55 and sources/sinkers 54 and 56 are arranged above and below the memory cell array MCA on the drawing surface, and connected to the source lines SL and bit lines BL.

In this embodiment as described previously, the directions of generated magnetic fields are different even in the left and right cells of, e.g., the source line contact 20_a_, so the direction of an electric current may change. Accordingly, the core circuits are desirably designed so that the write current bidirectionally flows through both the bit lines BL and source lines SL.

Note that the positions of the individual core circuits are not limited to those of the example shown in FIG. 17, so these circuits may also be arranged in any positions around the memory cell array MCA as long as the write current bidirectionally flows through the bit lines BL and source lines SL.

[4-2] Example 1

FIGS. 18 and 19 are schematic views showing connection example 1 concerning the bit lines and source lines of the write-system core circuits according to the embodiment of the present invention. Connection example 1 pertaining to the bit lines and source lines according to the embodiment of the present invention will be explained below.

Referring to FIGS. 18 and 19, the write current bidirectionally flows through both the bit lines BL and source lines SL. That is, the sources/sinkers 54 and 56 are connected to both ends of the bit lines BL and source lines SL.

More specifically, around the memory cell array MCA as shown in FIG. 18, the source/sinker 54 is connected to one end of each of the plurality of source lines SL, and the source/sinker 56 is connected to the other end of each of the plurality of source lines SL. The source/sinker 54 comprises a plurality of source/sinker circuits 60 equal in number to the source lines SL. The source/sinker 56 comprises a plurality of source/sinker circuits 61 equal in number to the source lines SL. Each source/sinker circuit 60 has a current source 62, switches 63 and 64, and a ground terminal 65. Each source/sinker circuit 61 has a current source 66, switches 67 and 68, and a ground terminal 69. When selecting a given source line SL, therefore, the write current can be supplied to the source line SL rightward on the drawing surface by turning on the switches 63 and 68 of the source/sinker circuits 60 and 61, and can be supplied to the source line SL leftward on the drawing surface by turning on the switches 64 and 67.

Likewise, around the memory cell array MCA as shown in FIG. 19, the source/sinker 54 is connected to one end of each of the plurality of bit lines BL, and the source/sinker 56 is connected to the other end of each of the plurality of bit lines BL. The source/sinker 54 comprises a plurality of source/sinker circuits 70 equal in number to the bit lines BL. The source/sinker 56 comprises a plurality of source/sinker circuits 71 equal in number to the bit lines BL. Each source/sinker circuit 70 has a current source 72, switches 73 and 74, and a ground terminal 75. Each source/sinker circuit 71 has a current source 76, switches 77 and 78, and a ground terminal 79. When selecting a given bit line BL, therefore, the write current can be supplied to the bit line BL rightward on the drawing surface by turning on the switches 73 and 78 of the source/sinker circuits 70 and 71, and can be supplied to the bit line BL leftward on the drawing surface by turning on the switches 74 and 77.

[4-3] Example 2

FIGS. 20 and 21 are schematic views showing connection example 2 concerning the bit lines and source lines of the core circuits according to the embodiment of the present invention. Connection example 2 pertaining to the bit lines and source lines according to the embodiment of the present invention will be explained below.

As shown in FIGS. 20 and 21, example 2 differs from example 1 in that a switch stage is inserted between the memory cell array MCA and each of the sources/sinkers 54 and 56, such that the plurality of source lines SL use the sources/sinkers 54 and 56 as common drivers, and the plurality of bit lines BL use the sources/sinkers 54 and 56 as common drivers.

More specifically, around the memory cell array MCA as shown in FIG. 20, a switch 81 is connected to one end of each of the plurality of source lines SL, and a switch 82 is connected to the other end of each of the plurality of source lines SL. The source/sinker 54 is connected to the plurality of switches 81, and the source/sinker 56 is connected to the plurality of switches 82. The source/sinker 54 has a current source 62, switches 63 and 64, and a ground terminal 65. The source/sinker 56 has a current source 66, switches 67 and 68, and a ground terminal 69. When selecting a given source line SL, therefore, the source line SL can be connected to the sources/sinkers 54 and 56 as common drivers by turning on the switches 81 and 82 corresponding to the source line SL. Also, the write current can be supplied to the source line SL rightward on the drawing surface by turning on the switches 63 and 68, and can be supplied to the source line SL leftward on the drawing surface by turning on the switches 64 and 67.

Likewise, around the memory cell array MCA as shown in FIG. 21, a switch 91 is connected to one end of each of the plurality of bit lines BL, and a switch 92 is connected to the other end of each of the plurality of bit lines BL. The source/sinker 56 is connected to the plurality of switches 91, and the source/sinker 54 is connected to the plurality of switches 92. The source/sinker 54 has a current source 72, switches 73 and 74, and a ground terminal 75. The source/sinker 56 has a current source 76, switches 77 and 78, and a ground terminal 79. When selecting a given bit line BL, therefore, the bit line BL can be connected to the sources/sinkers 54 and 56 as common drivers by turning on the switches 91 and 92 corresponding to the bit line BL. Also, the write current can be supplied to the bit line BL rightward on the drawing surface by turning on the switches 73 and 78, and can be supplied to the bit line BL leftward on the drawing surface by turning on the switches 74 and 77.

Example 2 as described above can suppress the complexity of the layout of the core units connected to the ends of the memory cell array MCA, when compared to example 1 in which the source/sinker is connected to each of the plurality of source lines SL and the plurality of bit lines BL.

[4-4] Write Operations ("1" Write)

A "1" write operation using the core circuits according to the embodiment of the present invention will be explained below with reference to FIG. 22. In the example shown in FIG. 22, an object of write is the MTJ element 10*a* in accordance with FIG. 5A, and example 1 shown in FIGS. 18 and 19 is used as the core circuits.

First, the switch 64 of the source/sinker circuit 60 connected to the source line SLa and the switch 73 of the source/sinker circuit 70 connected to the bit line BL are turned on, and other switches in the sources/sinkers 54 and 56 are turned off. Consequently, the left end portion of the bit line BL is connected to the current source, and the left end portion of the source line SLa is connected to the ground terminal. In addition, the selection transistor Tra is turned on, and other selection transistors are turned off. As a result, the write current I flows to the right on the drawing surface from the left end portion of the bit line BL. The write current I flows through the bit line contact 20*c* and transistor Tra in this order, and flows into the MTJ element 10*a*. Then, the write current I flows through the source line SLa via the source line contact 30*a*, and flows into the ground terminal.

The write current I flowing through the bit line BL generates a magnetic field around the bit line BL. This magnetic field is applied to the MTJ element 10*a* backward on the drawing surface. On the other hand, the write current I passing through the MTJ element 10*a* flows from the fixed layer to the recording layer, i.e., flows forward on the drawing surface. Accordingly, the magnetic field generated by the write current I having passed through the bit line BL is applied in the direction opposite to that of the write current I flowing through the MTJ element 10*a* (condition (2)).

Note that in FIG. 22, the switches 77 and 78 at the right end portion of the bit line BL positioned beside the MTJ element 10*a* are turned off and set to float so that the write current I flows through the bit line BL. However, the present invention is not limited to this. For example, it is also possible to turn on not only the switch 73 but also the switch 77, so that the potential at the right end portion of the bit line BL is higher than that at the left end portion of the bit line BL.

Note also that in FIG. 22, it is also possible to connect the right end portion of the source line SLa to the ground terminal by turning on the switch 68 instead of the switch 64. In this case, the write current I flows as shown in FIG. 5B.

("0" Write)

A "0" write operation using the core circuits according to the embodiment of the present invention will be explained below with reference to FIG. 23. In the example shown in FIG. 23, an object of write is the MTJ element 10*a* in accordance with FIG. 7A, and example 1 shown in FIGS. 18 and 19 is used as the core circuits.

First, the switch 63 of the source/sinker circuit 60 connected to the source line SLa and the switch 74 of the source/sinker circuit 70 connected to the bit line BL are turned on, and other switches in the sources/sinkers 54 and 56 are turned off. Consequently, the left end portion of the source line SLa is connected to the current source, and the left end portion of the bit line BL is connected to the ground terminal. In addition, the selection transistor Tra is turned on, and other selection transistors are turned off. As a result, the write current I flows to the right on the drawing surface from the left end portion of the source line SLa. The write current I flows through the MTJ element 10*a* via the source line contact 30*a*. Then, the write current I flows through the transistor Tra and bit line contact 20*c* in this order, flows through the bit line BL leftward, and flows into the ground terminal.

The write current I flowing through the bit line BL generates a magnetic field around the bit line BL. This magnetic field is applied to the MTJ element 10*a* forward on the drawing surface. On the other hand, the write current I passing through the MTJ element 10*a* flows from the recording layer to the fixed layer, i.e., flows backward on the drawing surface. Accordingly, the magnetic field generated by the write current I having passed through the bit line BL is applied in the direction opposite to that of the write current I flowing through the MTJ element 10*a* (condition (2)).

Figure 23:
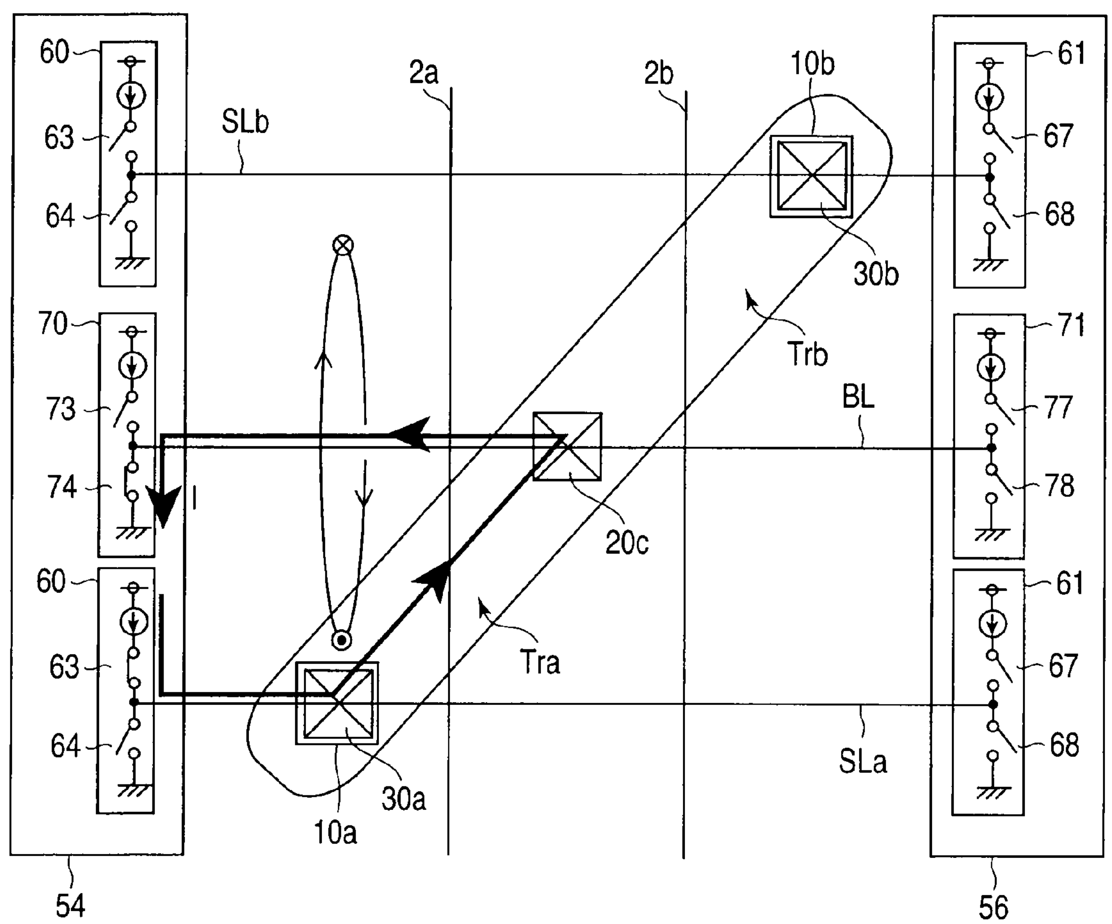
FIG. 23 is an exemplary view for explaining a "0" write operation using the core circuits according to the embodiment of the present invention.

Note that in FIG. 23, the switches 77 and 78 at the right end portion of the bit line BL positioned beside the MTJ element 10*a* are turned off and set to float so that the write current I flows through the bit line BL. However, the present invention is not limited to this. For example, it is also possible to turn on not only the switch 74 but also the switch 77, so that the potential at the right end portion of the bit line BL is higher than that at the left end portion of the bit line BL.

Note also that in FIG. 23, it is also possible to connect the right end portion of the source line SLa to the ground terminal by turning on the switch 67 instead of the switch 63. In this case, the write current I flows as shown in FIG. 7B.

[5] Read Method

A read method of this embodiment uses the magnetoresistive effect.

The transistor Tr connecting to the MTJ element 10 of a selected cell is turned on to supply a read current from, e.g., the source line SL to the transistor Tr through the MTJ element 10. Whether the data is "1" or "0" is discriminated by the resistance value of the MTJ element 10 read out on the basis of this read current.

Note that the read operation can be performed by reading out a current value by applying a constant voltage, or by reading out a voltage value by supplying a constant current.

[6] MTJ Element

[6-1] Magnetization Arrangement

The MTJ element 10 of this embodiment is desirably a so-called perpendicular magnetization type element in which a reversal magnetic field Hc temporarily lowers under the influence of, e.g., heat or electron spin when an electric current flows. That is, the magnetizations in the fixed layer 11 and recording layer 13 are perpendicular to the film surfaces. This further increases the magnetic field assisting effect.

Note that the magnetizations in the fixed layer 11 and recording layer 13 may also be parallel to the film surfaces (an in-plane or parallel magnetization type element), although the magnetic field assisting effect of this embodiment becomes smaller than that of the perpendicular magnetization type element.

[6-2] Materials

Examples of the materials of the MTJ element 10 are as follows.

Favorable examples of the materials of the fixed layer 11 and recording layer 13 are Fe, Co, Ni, and their alloys, magnetite having a high spin polarization ratio, oxides such as $CrO_2$ and $RXMnO_{3-y}$ (R; rare earth element, X; Ca, Ba, and Sr), and Heusler alloys such as NiMnSb and PtMnSb. These magnetic materials may more or less contain nonmagnetic elements such as Ag, Cu, Au, Al, Mg, Si, Bi, Ta, B, C, O, N, Pd, Pt, Zr, Ir, W, Mo, and Nb, provided that the materials do not loose ferromagnetism.

As the material of the nonmagnetic layer 12, it is possible to use various dielectrics such as $Al_2O_3$, $SiO_2$, MgO, AlN, $Bi_2O_3$, $MgF_2$, $CaF_2$, $SrTiO_2$, and $AlLaO_3$. These dielectrics may have oxygen, nitrogen, and fluorine deficiencies. The use of MgO is particularly advantageous for the device because a high MR is obtained.

An antiferromagnetic layer for fixing the magnetization direction in the fixed layer 11 may also be formed on the side of the fixed layer 11 away from the nonmagnetic layer 12. As the material of this antiferromagnetic layer, it is favorable to use, e.g., Fe—Mn, Pt—Mn, Pt—Cr—Mn, Ni—Mn, Ir—Mn, NiO, or $Fe_2O_3$.

Examples of a perpendicular magnetic material for implementing the perpendicular magnetization type MTJ element 10 are as follows.

First, a magnetic material having a high coercive force to be used as the perpendicular magnetic material of the fixed layer 11 and recording layer 13 is made of a material having a high magnetic anisotropic energy density of $1\times10^6$ erg/cc or more. Examples of the material will be explained below.

Example 1

"A material made of an alloy containing at least one of Fe (iron), Co (cobalt), and Ni (nickel) and at least one of Cr (chromium), Pt (platinum), and Pd (palladium)"

Examples of an ordered alloy are Fe(50)Pt(50), Fe(50)Pd(50), and Co(50)Pt(50). Examples of a random alloy are a CoCr alloy, CoPt alloy, CoCrPt alloy, CoCrPtTa alloy, and CoCrNb alloy.

Example 2

"A material having a structure in which at least one of Fe, Co, and Ni or an alloy containing one of these elements and one of Pd and Pt or an alloy containing one of these elements are alternately stacked"

Examples are a Co/Pt artificial lattice, Co/Pd artificial lattice, and CoCr/Pt artificial lattice. When the Co/Pt artificial lattice or Co/Pd artificial lattice is used, a high resistance change ratio (MR ratio) of about 40% can be achieved.

Example 3

"An amorphous alloy containing at least one rare earth metal such as Tb (terbium), Dy (dysprosium), or Gd (gadolinium), and at least one transition metal"

Examples are TbFe, TbCo, TbFeCo, DyTbFeCo, and GdTbCo.

The recording layer 13 can be made of the magnetic material having a high coercive force as described above, and can also be made of a magnetic material having a magnetic anisotropic energy density lower than that of the magnetic material having a high coercive force as described above, by adjusting the composition ratio, adding an impurity, or adjusting the thickness. Examples of the material will be explained below.

Example 1

"A material obtained by adding an impurity to an alloy containing at least one of Fe, Co, and Ni and at least one of Cr, Pt, and Pd"

An example of an ordered alloy is a material obtained by decreasing the magnetic anisotropic energy density by adding an impurity such as Cu, Cr, or Ag to Fe(50)Pt(50), Fe(50)Pd(50), or Co(50)Pt(50). An example of a random alloy is a material obtained by decreasing the magnetic anisotropic energy density by increasing the ratio of a nonmagnetic element in a CoCr alloy, CoPt alloy, CoCrPt alloy, CoCrPtTa alloy, or CoCrNb alloy.

Example 2

"A material having a structure in which at least one of Fe, Co, and Ni or an alloy containing one of these elements and one of Pd and Pt or an alloy containing one of these elements are alternately stacked, and the thickness of the layer made of the former element or alloy or the thickness of the layer made of the latter element or alloy is adjusted"

The thickness of the layer made of at least one of Fe, Co, and Ni or an alloy containing one of these elements has an optimum value, and the thickness of the layer made of one of Pd and Pt or an alloy containing one of these elements has an optimum value. As the thicknesses deviate from these optimum values, the magnetic anisotropic energy density decreases.

Example 3

"A material obtained by adjusting the composition ratio of an amorphous alloy containing at least one rare earth metal such as Tb (terbium), Dy (dysprosium), or Gd (gadolinium) and at least one transition metal"

An example is a material obtained by decreasing the magnetic anisotropic energy density by adjusting the composition ratio of an amorphous alloy such as TbFe, TbCo, TbFeCo, DyTbFeCo, or GdTbCo.

Note that this embodiment can also take a stacked free layer structure in which any of the above-mentioned materials is used as a part of the stacked film.

Note also that as used in the MO material, the material of (example 3) described above lowers the magnetization holding force by heat generated when an electric current flows through the MTJ element 10 as a resistor or by the electric current itself. When the material of (example 3) is used, therefore, a low-current reversing effect is obtained as long as a vector is tightly fixed by the magnetic field assisting effect of this embodiment. To obtain this effect, a magnetic layer (e.g., FePt) containing one of Tb, Co, and Fe is particularly desirable.

[6-3] Planar Shape

The planar shape of the MTJ element 10 of this embodiment can be variously changed. Examples are a rectangle, square, circle, ellipse, hexagon, rhomb, parallelogram, cross, and bean (recessed shape).

The perpendicular magnetization type MTJ element 10 can have any of the above shapes because the magnetization direction is independent of the shape.

When using the magnetic shape anisotropy of the parallel magnetization type MTJ element 10, if the dimension in the widthwise direction (the direction of hard magnetization) of the MTJ element 10 is F (a minimum feature size), the dimension in the longitudinal direction (the direction of easy magnetization) is desirably about 2F.

[6-4] Tunnel Junction Structure

The MTJ element 10 may have a single tunnel junction (single-junction) structure or double tunnel junction (double-junction) structure.

As shown in FIG. 2 and the like, the MTJ element 10 having the single tunnel junction structure has the fixed layer 11, the recording layer 13, and the nonmagnetic layer 12 formed between the fixed layer 11 and recording layer 13. That is, the MTJ element 10 has one nonmagnetic layer.

The MTJ element 10 having the double tunnel junction structure has a first fixed layer, a second fixed layer, a recording layer formed between the first and second fixed layers, a first nonmagnetic layer formed between the first fixed layer and recording layer, and a second nonmagnetic layer formed between the second fixed layer and recording layer. That is, the MTJ element 10 has two nonmagnetic layers.

When the same external bias is applied, the MR (Magneto Resistive) ratio (the resistance change ratio of state "1" to state "0") decreases less in the double tunnel junction structure than in the single tunnel junction structure, so the former can operate with a higher bias than the latter. That is, the double tunnel junction structure is advantageous in reading out information from a cell.

[7] Effects

In the embodiment of the present invention, the perpendicular magnetization type MTJ element 10 is used, and the bit line BL is placed parallel to the source line SL such that the bit line BL is positioned beside the MTJ element 10. In spin transfer torque write, the write current I is supplied to the bit line BL positioned beside the MTJ element 10 as an object of write, thereby applying the magnetic field generated by the write current I in the direction opposite to that of the write current I flowing through the MTJ element 10. Consequently, the magnetic field generated by the write current I assists magnetization reversal in the MTJ element 10.

In this embodiment as described above, the magnetic field assisting effect can be obtained without adding any interconnection for magnetic field assist or increasing the interconnection area unlike in the conventional devices. Accordingly, magnetization reversal can be assisted while the increase in cost is suppressed. Also, this embodiment facilitates the process because the element diameter need not be decreased with high controllability. Furthermore, this embodiment can implement a multilevel memory by current control.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin transfer type magnetic random access memory comprising:

a magnetoresistive effect element including a fixed layer, a recording layer, and a nonmagnetic layer sandwiched between the fixed layer and the recording layer, magnetizations in the fixed layer and the recording layer being perpendicular to a film surface;

a source line connected to one terminal of the magnetoresistive effect element;

a transistor having a current path whose one end is connected to the other terminal of the magnetoresistive effect element;

a bit line connected to the other end of the current path of the transistor, and running parallel to the source line; and a source/sinker which supplies a write current between the source line and the bit line via the magnetoresistive effect element and the transistor, a direction in which a magnetic field generated by the write current having passed through the bit line is applied to the magnetoresistive effect element being opposite to a direction of the write current passing through the magnetoresistive effect element.

2. The memory according to claim 1, wherein the bit line is positioned beside the magnetoresistive effect element, and the magnetic field generated by the write current having passed through the bit line positioned beside the magnetoresistive effect element is applied to the magnetoresistive effect element.

3. The memory according to claim 2, wherein a central point of a film thickness of the bit line matches that of a film thickness of the recording layer.

4. The memory according to claim 1, wherein the magnetic field is applied in a direction to assist magnetization reversal caused in the recording layer by spin transfer torque.

5. The memory according to claim 1, wherein when writing first data in the magnetoresistive effect element, the write current is supplied from the fixed layer to the recording layer, and the magnetic field is applied form the recording layer to the fixed layer, and when writing second data in the magnetoresistive effect element, the write current is supplied from the recording layer to the fixed layer, and the magnetic field is applied from the fixed layer to the recording layer.

6. The memory according to claim 1, wherein the recording layer is positioned closer to the source line than the fixed layer.

7. The memory according to claim 1, wherein an element region in which the transistor is formed is formed obliquely to the direction in which the source line and the bit line run.

8. The memory according to claim 1, wherein the source line comprises a plurality of source lines, the bit line comprises a plurality of bit lines, and the plurality of source lines and the plurality of bit lines are alternately arranged parallel to a substrate surface.

9. The memory according to claim 1, further comprising a sidewall insulating film formed on a side surface of the magnetoresistive effect element, and brought into direct contact with the bit line.

10. The memory according to claim 1, wherein the source/sinker comprises a plurality of sources/sinkers, and the plurality of sources/sinkers are connected to both ends of the source line and both ends of the bit line.

11. The memory according to claim 1, wherein the source/sinker comprises a plurality of sources/sinkers, the source line comprises a plurality of source lines, and the bit line comprises a plurality of bit lines, the sources/sinkers are connected to both ends of the plurality of source lines, and the sources/sinkers are connected to both ends of the plurality of bit lines.

12. The memory according to claim 1, in which the source line comprises a plurality of source lines, and the bit line comprises a plurality of bit lines, and which further comprises:

a plurality of first switches each connected to one end of a corresponding one of the plurality of source lines, a plurality of second switches each connected to the other end of a corresponding one of the plurality of source lines, a plurality of third switches each connected to one end of a corresponding one of the plurality of bit lines, and a plurality of fourth switches each connected to the other end of a corresponding one of the plurality of bit lines, and in which the source/sinker comprises a first source/sinker connected to the plurality of first switches, a second source/sinker connected to the plurality of second switches, a third source/sinker connected to the plurality of third switches, and a fourth source/sinker connected to the plurality of fourth switches.

13. The memory according to claim 1, wherein a material of the recording layer contains one of Tb, Co, and Fe, and a magnetization holding force of the recording layer is lowered by heat generated when the write current passes through the magnetoresistive effect element, thereby assisting magnetization reversal in the recording layer.

14. A write method of a spin transfer type magnetic random access memory including a magnetoresistive effect element including a fixed layer, a recording layer, and a nonmagnetic layer sandwiched between the fixed layer and the recording layer, magnetizations in the fixed layer and the recording layer being perpendicular to a film surface;

a source line connected to one terminal of the magnetoresistive effect element, a transistor having a current path whose one end is connected to the other terminal of the magnetoresistive effect element, and a bit line connected to the other end of the current path of the transistor, and running parallel to the source line, the method comprising supplying a write current between the source line and the bit line via the magnetoresistive effect element and the transistor, a direction in which a magnetic field generated by the write current having passed through the bit line is applied to the magnetoresistive effect element being opposite to a direction of the write current passing through the magnetoresistive effect element.

15. The method according to claim 14, wherein the bit line is positioned beside the magnetoresistive effect element, and the magnetic field generated by the write current having passed through the bit line positioned beside the magnetoresistive effect element is applied to the magnetoresistive effect element.

16. The method according to claim 14, wherein the magnetic field is applied in a direction to assist magnetization reversal caused in the recording layer by spin transfer torque.

17. The method according to claim 14, wherein a material of the recording layer contains one of Tb, Co, and Fe, and a magnetization holding force of the recording layer is lowered by heat generated when the write current passes through the magnetoresistive effect element, thereby assisting magnetization reversal in the recording layer.

18. The method according to claim 14, wherein when writing first data in the magnetoresistive effect element, the write current is supplied from the fixed layer to the recording layer, and the magnetic field is applied form the recording layer to the fixed layer, and when writing second data in the magnetoresistive effect element, the write current is supplied from the recording layer to the fixed layer, and the magnetic field is applied from the fixed layer to the recording layer.

19. The method according to claim 14, wherein the recording layer is positioned closer to the source line than the fixed layer.

20. The method according to claim 14, wherein the write current bidirectionally flows through both the source line and the bit line.

* * * * *